United States Patent
Morihara et al.

(10) Patent No.: US 6,871,320 B1
(45) Date of Patent: Mar. 22, 2005

(54) DATA COMPRESSING APPARATUS, RECONSTRUCTING APPARATUS, AND METHOD FOR SEPARATING TAG INFORMATION FROM A CHARACTER TRAIN STREAM OF A STRUCTURED DOCUMENT AND PERFORMING A CODING AND RECONSTRUCTION

(75) Inventors: Takashi Morihara, Kawasaki (JP); Hironori Yahagi, Kawasaki (JP); Noriko Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/352,355

(22) Filed: Jul. 13, 1999

(30) Foreign Application Priority Data

Sep. 28, 1998 (JP) .......................................... 10-272724

(51) Int. Cl.⁷ .............................................. G06F 17/00
(52) U.S. Cl. ...................................................... 715/513
(58) Field of Search ................................. 715/513, 500, 715/501.1, 531, 534, 540

(56) References Cited

U.S. PATENT DOCUMENTS

| | | | | | |
|---|---|---|---|---|---|
| 5,016,009 A | * | 5/1991 | Whiting et al. | ................ | 341/67 |
| 5,414,425 A | * | 5/1995 | Whiting et al. | ................ | 341/67 |
| 5,590,258 A | * | 12/1996 | Aoyama | ...................... | 707/531 |
| 5,627,995 A | * | 5/1997 | Miller et al. | ................. | 711/171 |
| 5,889,481 A | * | 3/1999 | Okada | .......................... | 341/51 |
| 6,330,574 B1 | * | 12/2001 | Murashita | .................... | 715/513 |

* cited by examiner

*Primary Examiner*—Sanjiv Shah
(74) *Attorney, Agent, or Firm*—Staas & Halsey LLP

(57) ABSTRACT

A tag information separating unit separates a tag identified from a character train stream and outputs as tag information. A tag code replacing unit arranges a tag code for identification to a position of the character train stream in which the tag was separated. A character train coding unit compression encodes the character train stream including a tag code which is outputted from the tag code replacing unit. A data reconstructing apparatus reconstructs the character train stream by the operation opposite to the compression.

13 Claims, 28 Drawing Sheets

FIG. 1 PRIOR ART

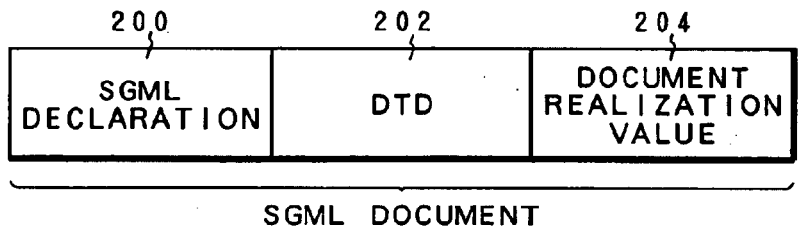

SGML DOCUMENT

FIG. 2 PRIOR ART

```
          .........
<!--========Link Markup========-->
<!ENTITY % linkType "NAMES">
<!ENTITY % linkExtraAttributes
      "REL %linkType#IMPLIED
      REV %linkType#IMPLIED
      URN CDATA#IMPLIED
      TITLE CDATA#IMPLIED
      METHODS NAMES#IMPLIED
      ">
<![% HTML.Recommended [
      <!ENTITY % A.content   "(%text)* "
      --<H1><a name="xxx">Heading</a></H1>
              is preferred to
         <a name="xxx"></H1>Heading</H1></a>
      -->
]]>
<!ENTITY % A.content  "(%heading | %text)* ">
<!ELEMENT A       --%A.content-(A)>
<!ATTLIST A
      HREF CDATA#IMPLIED
      NAME CDATA#IMPLIED
      %linkExtraAttributes;
      %SDAPREF;"<Anchor:#AttList>"
<!--<A>          Anchor;source/destination of link  -->
<!--<A NAME="..."> Name of this anchor             -->
<!--<A HREF="..."> Address of link destination     -->
<!--<A URN="..."> Permanent address of destination -->
          .........
```

FIG. 3

```
<TITLE> SPECIFICATION OF THE INVENTION(DEVICE) </TITLE>
<SECTION>TITLE OF THE INVENTION(DEVICE) </SECTION>
    DATA COMPRESSING·RECONSTRUCTING METHOD AND APPARATUS AND DOCUMENT
    MANAGEMENT SYSTEM<P>
<SECTION> SCOPE OF CLAIM</SECTION>
<SUBSECTION> A DATA COMPRESSING APPARATUS FOR ENCODING INPUT DATA,
            </SUBSECTION>
<LIST>
    <ITEM> MEANS FOR HOLDING A CODE TABLE
    <ITEM> STEP OF ENCODING INPUT DATA ON THE BASIS OF A CODE TABLE
</LIST> A DATA COMPRESSING METHOD CHARACTERIZED BY COMPRISING: <P>
<SECTION> DETAILED DESCRIPTION OF THE INVENTION</SECTION>
<SUBSECTION> INDUSTRIAL FIELD OF UTILIZATION</SUBSECTION>
<PARAGRAPH> IN RECENT YEARS, VARIOUS KINDS OF DATA SUCH AS CHARACTER
    CODES, VECTOR INFORMATION, AND IMAGES HAS BEEN HANDLED BY A COMPUTER
    AND AN AMOUNT OF DATA WHICH IS HANDLED IS ALSO RAPIDLY INCREASING.
    WHEN A LARGE AMOUNT OF DATA IS HANDLED, BY COMPRESSING THE DATA
    AMOUNT BY OMITTING REDUNDANT PORTIONS IN THE DATA, A MEMORY CAPACITY
    CAN BE REDUCED AND THE DATA CAN BE TRANSMITTED AT A HIGH SPEED.
<PARAGRAPH>RECENTLY, THERE IS A TREND OF UNIFYING FORMATS OF DOCUMENTS
    WHICH ARE HANDLED BY COMPUTERS. THE FORMATS OF DOCUMENTS WHICH WERE
    DIFFERENT FOR COMPUTERS OR APPLICATIONS SO FAR ARE ENABLED TO BE USED
    EVEN BY DIFFERENT COMPUTERS. <TT> SGML (STANDARD GENERALIZED MARKUP
    LANGUAGE) </TT> IN 1986, IS
```

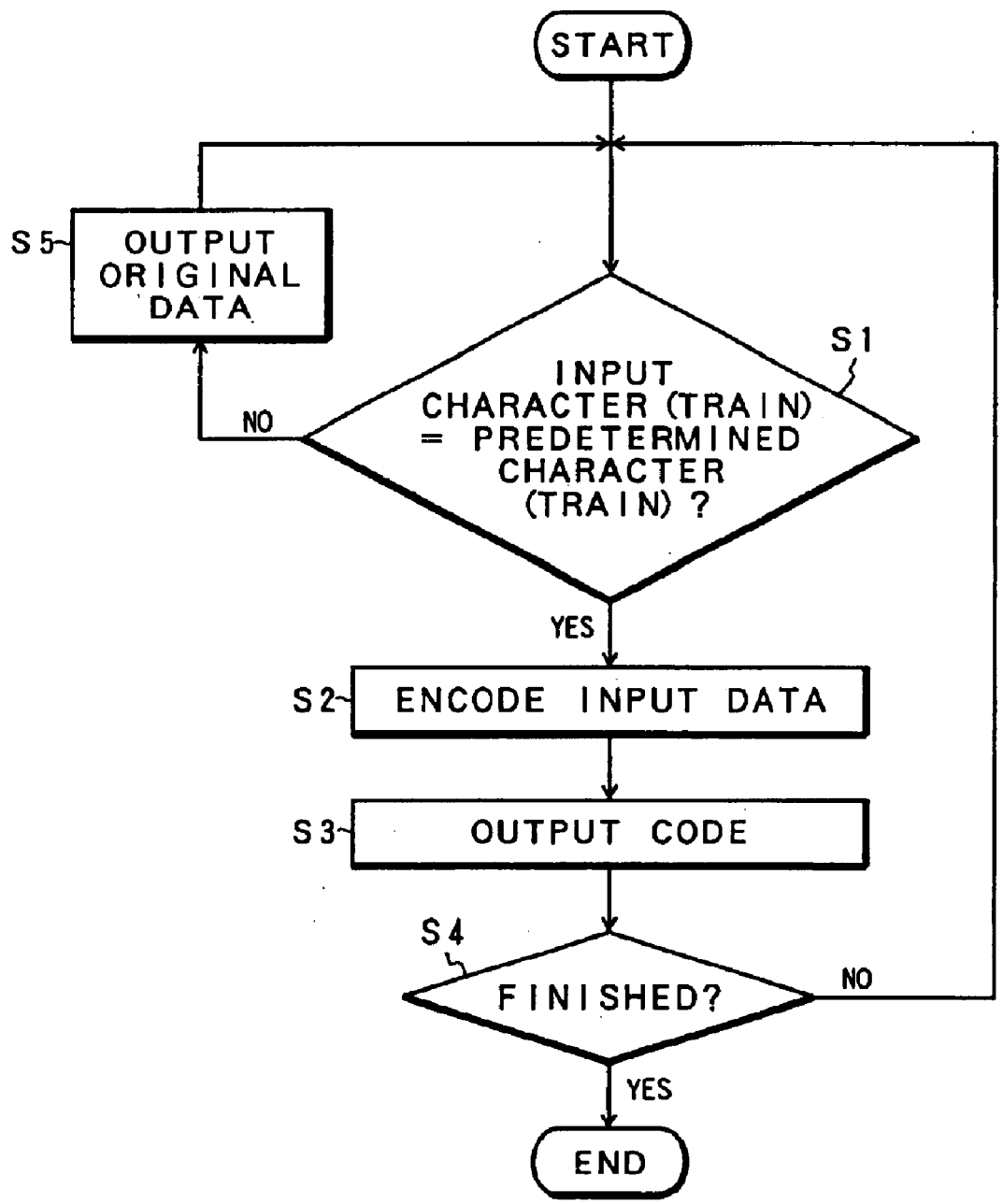
F I G. 4

F I G. 5

```
<TITLE>SPECIFICATION OF THE INVENTION (DEVICE) </TITLE> <P>
<SECTION>TITLE OF THE INVENTION (DEVICE) </SECTION>
275fe5a1d8... (COMPRESSION AREA) .... 6efc312903
<SECTION> SCOPE OF CLAIM</SECTION>
<SUBSECTION>A DATA COMPRESSING APPARATUS FOR ENCODING INPUT DATA,
         </SUBSECTION>
6ef208ca9d....  (COMPRESSION AREA)   ... 358eac0e66f8
<SECTION>DETAILED DESCRIPTION OF THE INVENTION</SECTION>
<SUBSECTION> INDUSTRIAL FIELD OF UTILIZATION</SUBSECTION>
398ecad978... (COMPRESSION AREA)       ffd938e06b
```

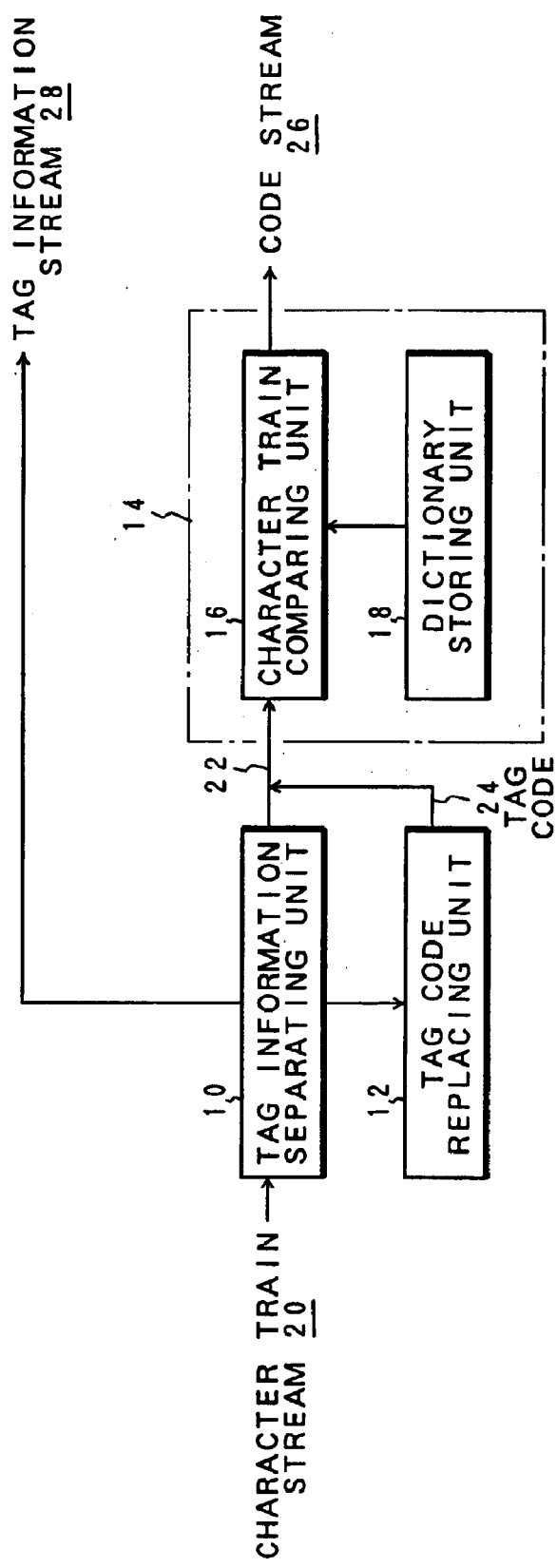
F I G. 6

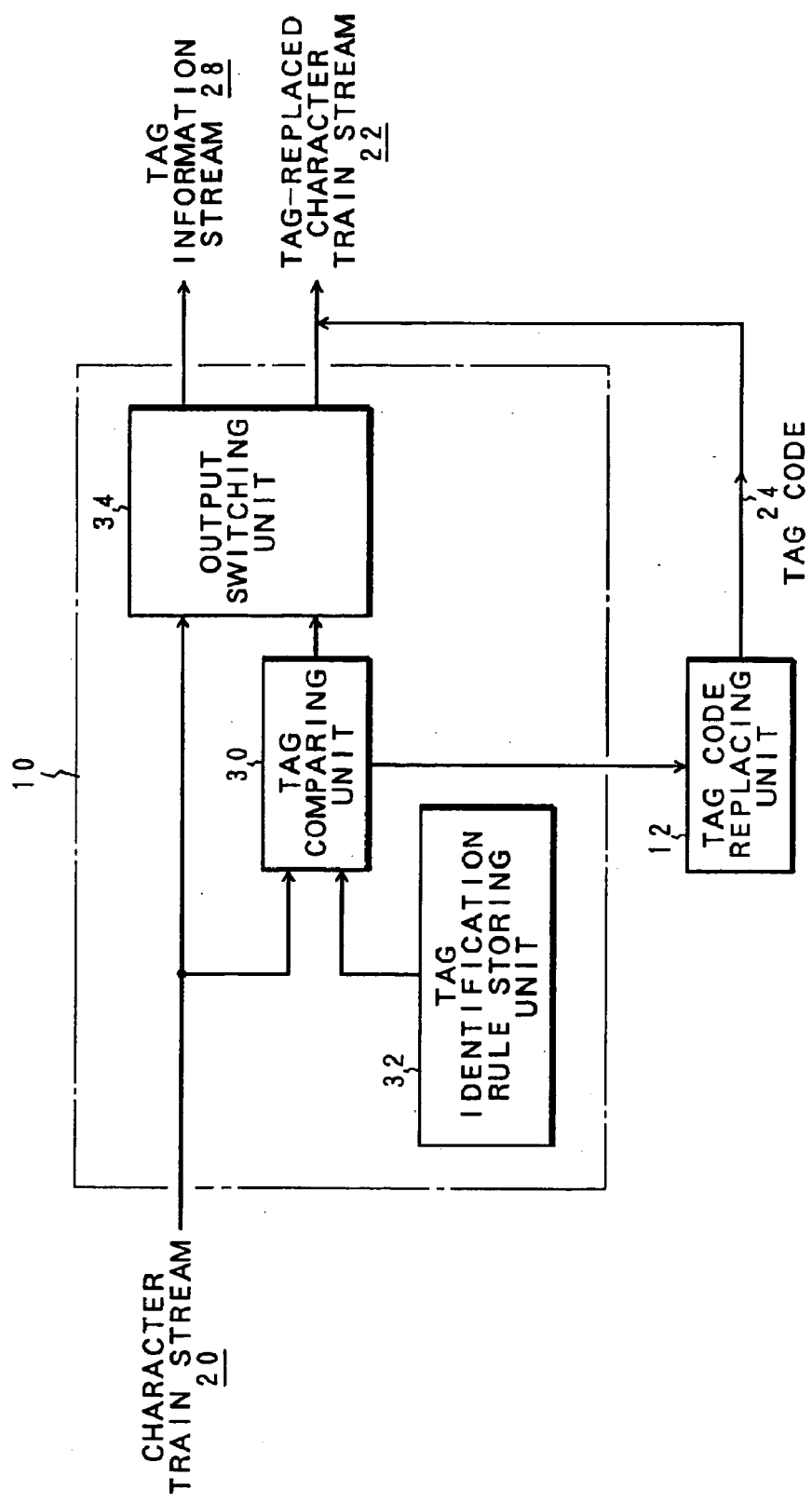

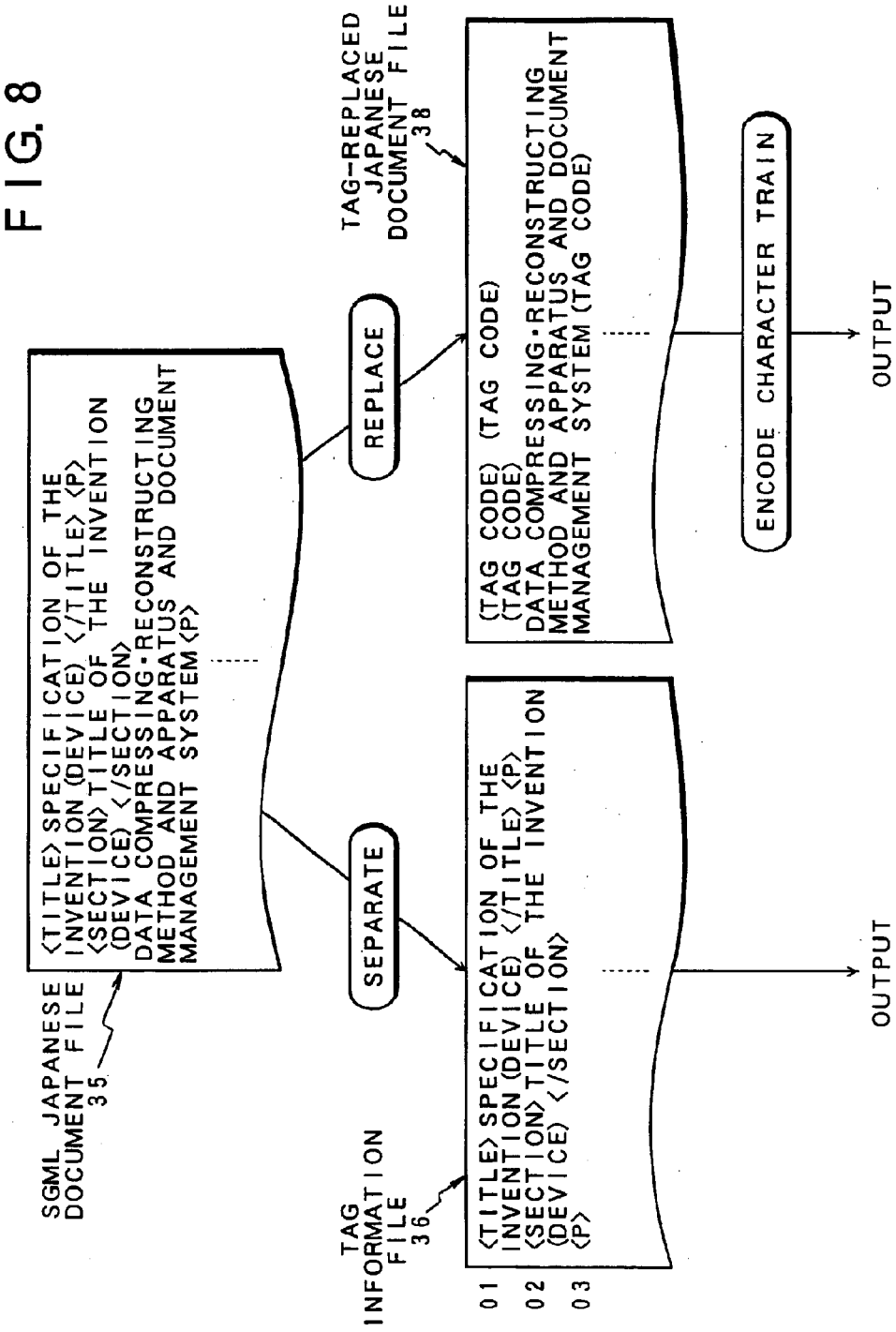

(TAG CODE) (TAG CODE)
(TAG CODE)
　　DATA COMPRESSING·RECONSTRUCTING METHOD AND APPARATUS AND DOCUMENT
　　MANAGEMENT SYSTEM (TAG CODE)
(TAG CODE)
(TAG CODE)
(TAG CODE)
A DATA COMPRESSING METHOD CHARACTERIZED BY COMPRISING THE STEPS OF :
　(TAG CODE)
(TAG CODE)
(TAG CODE)
(TAG CODE) IN RECENT YEARS, VARIOUS KINDS OF DATA SUCH AS CHARACTER
CODES, VECTOR INFORMATION, AND IMAGES HAS BEEN HANDLED BY A COMPUTER
AND AN AMOUNT OF DATA WHICH IS HANDLED IS ALSO RAPIDLY INCREASING.
WHEN A LARGE AMOUNT OF DATA IS HANDLED, BY COMPRESSING THE DATA,
AMOUNT BY OMITTING REDUNDANT PORTIONS IN THE DATA, A MEMORY CAPACITY
CAN BE REDUCED AND THE DATA CAN BE TRANSMITTED AT A HIGH SPEED.
(TAG CODE) RECENTLY, THERE IS A TREND OF UNIFYING FORMATS OF DOCUMENTS
WHICH ARE HANDLED BY COMPUTERS. THE FORMATS OF DOCUMENTS WHICH WERE
DIFFERENT FOR COMPUTERS OR APPLICATIONS SO FAR ARE ENABLED TO BE USED
EVEN BY DIFFERENT COMPUTERS. (TAG CODE) IN 1986, ISO...

FIG. 10

```
01  <TITLE>SPECIFICATION OF THE INVENTION (DEVICE) </TITLE>
02  <P>
03  <SECTION>TITLE OF THE INVENTION (DEVICE) </SECTION>
04  <P>
05  <SECTION>SCOPE OF CLAIM</SECTION>
06  <SUBSECTION>A DATA COMPRESSING APPARATUS FOR ENCODING INPUT DATA
            </SUBSECTION>
07  <LIST>
        <ITEM>MEANS FOR HOLDING A CODE TABLE
        <ITEM>STEP OF ENCODING INPUT DATA ON THE BASIS OF A CODE TABLE
    </LIST>
    <P>
08  <SECTION>DETAILED DESCRIPTION OF THE INVENTION </SECTION>
09
10  <SUBSECTION>INDUSTRIAL FIELD OF UTILIZATION</SUBSECTION>
11  <PARAGRAPH>
12  <PARAGRAPH>
13  <TT> SGML (STANDARD GENERALIZED MARKUP LANGUAGE) </TT>
```

F I G . 11

38

(TAG CODE 1) (TAG CODE 2)
(TAG CODE 3)
DATA COMPRESSING-RECONSTRUCTING METHOD AND APPARATUS AND DOCUMENT
MANAGEMENT SYSTEM (TAG CODE 4)
(TAG CODE 5)
(TAG CODE 6)
(TAG CODE 7)
A DATA COMPRESSING METHOD CHARACTERIZED BY COMPRISING THE STEPS OF:
  (TAG CODE 8)
(TAG CODE 9)
(TAG CODE 10)
(TAG CODE 11) IN RECENT YEARS, VARIOUS KINDS OF DATA SUCH AS CHARACTER
CODES, VECTOR INFORMATION, AND IMAGES HAS BEEN HANDLED BY A COMPUTER
AND AN AMOUNT OF DATA WHICH IS HANDLED IS ALSO RAPIDLY INCREASING.
WHEN A LARGE AMOUNT OF DATA IS HANDLED, BY COMPRESSING THE DATA
AMOUNT BY OMITTING REDUNDANT PORTIONS IN THE DATA, A MEMORY CAPACITY
CAN BE REDUCED AND THE DATA CAN BE TRANSMITTED AT A HIGH SPEED.
(TAG CODE 12) RECENTLY, THERE IS A TREND OF UNIFYING FORMATS OF
DOCUMENTS WHICH ARE HANDLED BY COMPUTERS. THE FORMATS OF DOCUMENTS
WHICH WERE DIFFERENT FOR COMPUTERS OR APPLICATIONS SO FAR ARE ENABLED
TO BE USED EVEN BY DIFFERENT COMPUTERS. (TAG CODE 13) IN 1986, ISO...

FIG.13

| PART OF SPEECH CLASS | THE NUMBER OF MORPHEMES (THE TOTAL NEMBER) | COMPONENT RATIO (%) | THE NUMBER OF MORPHEMES (THE DIFFERENT NUMBER) | COMPONENT RATIO (%) |
|---|---|---|---|---|
| NOUN CLASS | 1,375,378 | 26.1 | 110,912 | 81.3 |
| VERB CLASS | 622,125 | 11.8 | 14,638 | 10.7 |
| ADJECTIVE CLASS | 58,742 | 1.1 | 1,204 | 0.9 |
| ADJECTIVE VERB CLASS | 61,192 | 1.2 | 3,796 | 2.8 |
| ADVERB CLASS | 74,332 | 1.4 | 2,934 | 2.1 |
| PARTICIPIAL ADJECTIVE CLASS | 40,271 | 0.8 | 247 | 0.2 |
| CONJUNCTION CLASS | 23,562 | 0.4 | 247 | 0.2 |
| PREFIX CLASS | 21,063 | 0.4 | 318 | 0.2 |
| SUFFIX CLASS | 122,954 | 2.3 | 1,330 | 1.0 |
| WORDS' ENDING CLASS | 631,304 | 12.0 | 155 | 0.1 |
| POST POSITIONAL WORD CLASS | 1,402,757 | 26.7 | 171 | 0.1 |
| AUXILIARY VERB CLASS | 319,852 | 6.1 | 203 | 0.1 |
| INTERJECTION CLASS | 356 | 0.0 | 105 | 0.1 |
| OTHERS | 508,333 | 9.7 | 226 | 0.2 |
| TOTAL | 5,262,221 | 100.0 | 136,486 | 100.0 |

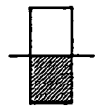
FIG. 15B
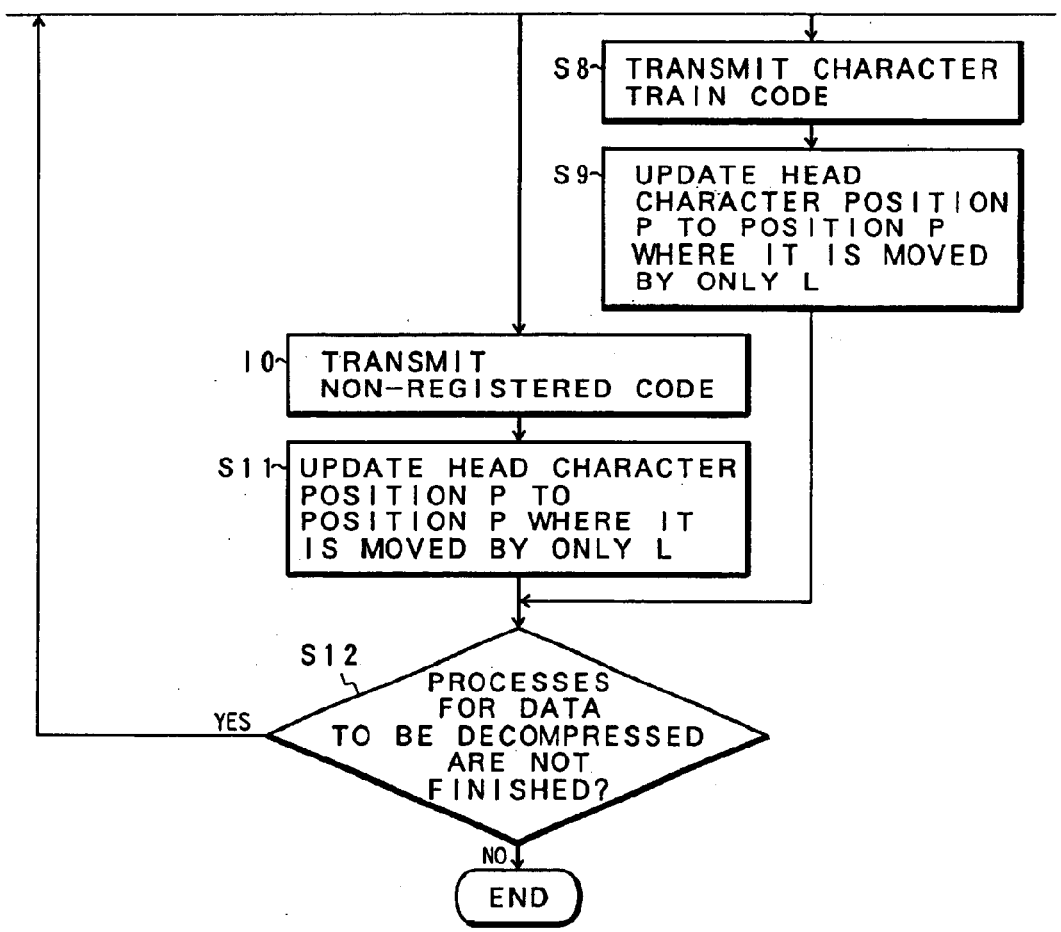

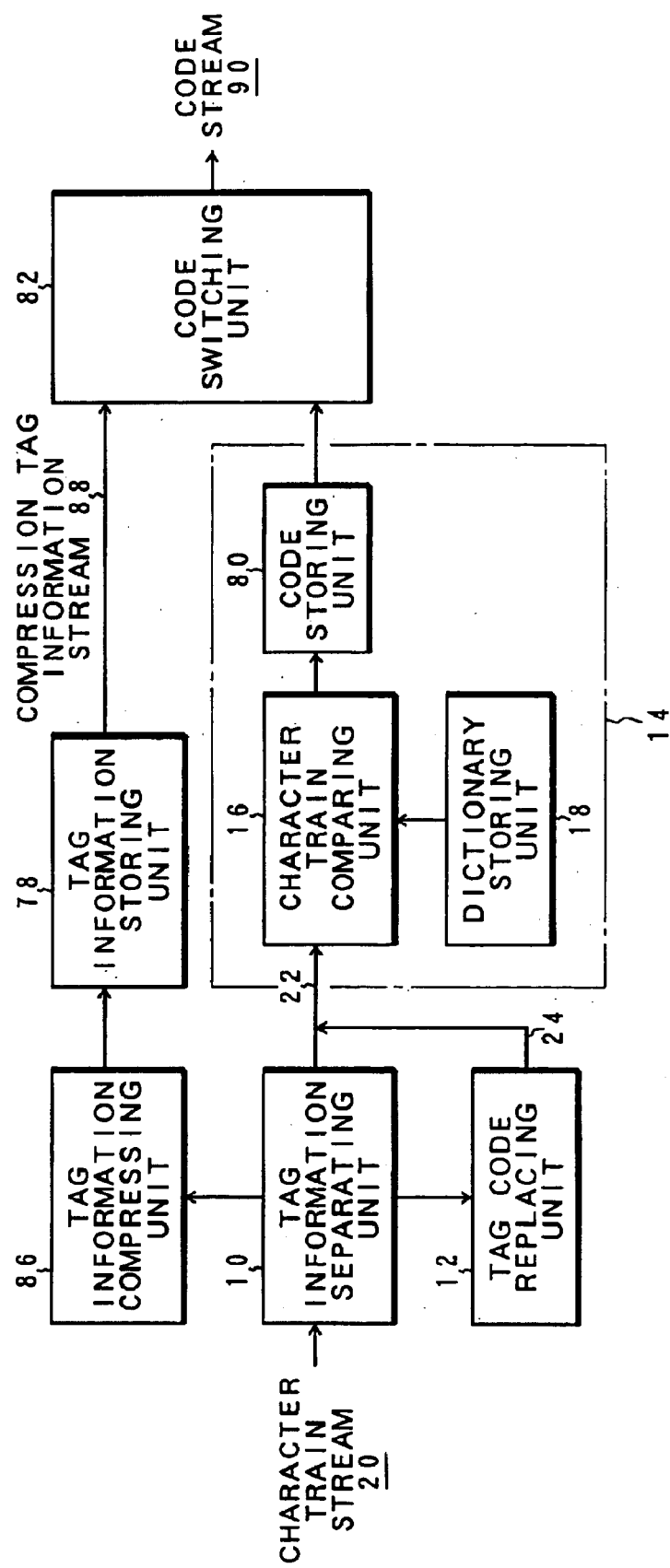
F I G. 21

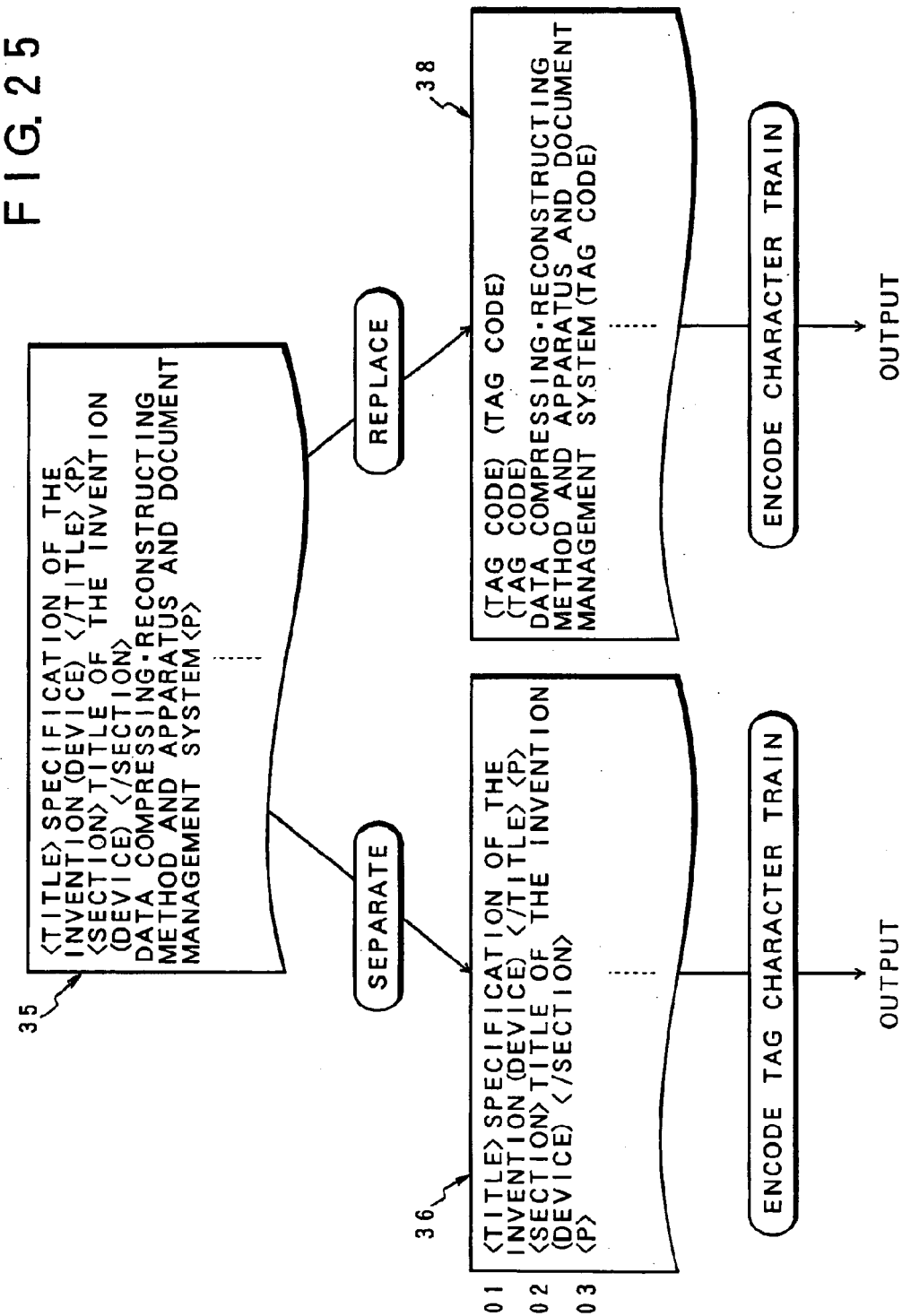

FIG. 26

```
     36
01  <TITLE>... (COMPRESSION AREA) ... </TITLE>              DL1
02  <P>                                                      DL2
03  <SECTION>... (COMPRESSION AREA) ... </SECTION>           DL3
04  <P>                                                      DL4
05  <SECTION>... (COMPRESSION AREA) ... </SECTION>           DL5
06  <SUBSECTION>... (COMPRESSION AREA) ... </SUBSECTION>     DL6
07  <LIST>... (COMPRESSION AREA) ... </LIST>                 DL7
08  <P>                                                      DL8
09  <SECTION>... (COMPRESSION AREA) ... </SECTION>           DL9
10  <SUBSECTION>... (COMPRESSION AREA) ... </SUBSECTION>     DL10
11  <PARAGRAPH>                                              DL11
12  <PARAGRAPH>                                              DL12
13  <TT>... (COMPRESSION AREA) ... </TT>                     DL13
    ...
```

106

DATA COMPRESSING APPARATUS, RECONSTRUCTING APPARATUS, AND METHOD FOR SEPARATING TAG INFORMATION FROM A CHARACTER TRAIN STREAM OF A STRUCTURED DOCUMENT AND PERFORMING A CODING AND RECONSTRUCTION

BACKGROUND OF THE INVENTION

1. Field of the Invention

The present invention relates to data compressing apparatus, reconstructing apparatus, and its method for forming code data from a character train stream constructed by a structured document including tags. More particularly, the invention relates to data compressing apparatus, reconstructing apparatus, and its method for separating tag information from a character train stream of a structured document and performing a coding and a reconstruction.

2. Description of the Related Arts

In recent years, various kinds of data such as character codes, image data, and the like is dealt in a computer. Further, in association with the spread of the Internet and Intranet, the numbers of E-mail and electronized documents are increasing. In such a large amount of data, by compressing the data by omitting redundant portions in the data, a storage capacity can be reduced or the compressed data can be sent to a remote place in a short time.

The field of the invention is not limited to the compression of character codes but can be applied to various data. It is now assumed hereinbelow that the denominations which are used in the information theory, one word unit of data is called a character, and data in which an arbitrary plurality of words are connected is called a character train.

Recently, there is a trend of unifying formats of documents which are handled on computers. In the trend, to efficiently form a document, a method whereby the contents of a document are partially distinguished by using tags, a plurality of document parts such as titles, paragraphs, and the like are preliminarily formed, the relations among the document parts are determined, and the document is structured and edited is tried. As examples of the structured documents such that a concept of a structure is taken in a document, there are structured documents according to the standards of ODA (ISO 8613: Open Document Architecture) and SGML (ISO 8879: Standard Generalized Markup Language) of international standards. As a document processing method using such a structured document, for example, there is a method of JP-A-5-135054. The structured document according to SGML has a high compatibility with a conventional text processing system and has been spread mainly from U.S.A. and put into practical use. In the structured document according to SGML, a template of the document structure is preliminarily given and the document structure is limited within the template.

FIG. 1 shows a SGML structured document constructed by three portions of SGML declaration 200, document type definition (DTD) 202, and document realization value 204. The template which defines the structure of the document is the document type definition 202. As shown in FIG. 2, the document structure such as chapter, paragraph, title, and the like is defined. In the structured document of SGML, in order to express the document structure, a document text is divided by using an identifier called a tag in the document text.

FIG. 3 shows a specific example of the structured document of SGML. For example, in case of a title of a document, it is expressed by "<TITLE> Specification of the Invention (Device)</TITLE>". That is, characters sandwiched by "<TITLE>" as a start tag and "</TITLE>" as an end tag are elements. In this case, the characters show the title contents "Specification of the Invention (Device)". At present, the number of cases of using SGML is increasing mainly from public organizations. Especially, in U.S.A., the Department of Defense obliges us to submit documents described by SGML. In Japan as well, such a structured document is adopted as a CD-ROM Official Gazette of the Patent Office. HTML (Hyper Text Markup Language) spread as a description form of WWW (World Wide Web) used by the Internet is one form of SGML.

As a method of compressing a structured document of such SGML or the like, the applicant of the present invention has proposed a method disclosed in Japanese Patent Application Laid-Open No. (JP-A) 9-261072. According to the method, when document data of a structured document having tag information is inputted, the tag information defined by the document type definition DTD or the like is detected. When the tag information is detected, the tag information is outputted as it is without converting. Further, since the tag information is detected, the operating mode is shifted to a mode for coding an input character train except for the tag information.

A basic algorithm of the coding is as shown in FIG. 4. First in step S1, whether an input character or character train is identical to the character or character train preliminarily registered in a dictionary or not is retrieved and compared. If YES, the input data is encoded by a registration number of the dictionary in step S2. In step S3, the code is outputted. When the same registered character or character train cannot be retrieved in step S1, the original input character or character train is outputted as it is in step S5. The above processes are repeated until there is no input character train in step S4. When the SGML document file of FIG. 3 is subjected to the encoding of FIG. 4, a compression data file of FIG. 5 is obtained. The compression data file has a form in which a portion of the tag information which is not compressed and a portion of a compressed text document mixedly exist in a single file.

According to a method of compressing the document text, since a document text having an enormous data amount can be compressed to a data amount which can be used in practice, this method is a very useful technique to realize an electronized document text. In the compression data file of the structured document as shown in FIG. 5, however, in case of retrieving the tag information in the file, the tag information mixedly exists as a non-compression portion in the compressed document data. The whole file has to be developed into a memory and the necessary tag information has to be retrieved. Even when the user wants to retrieve a keyword in the text as a compressed portion, it is similarly necessary to develop the whole file into the memory and process it. In order to retrieve or obtain the necessary document from the compression data file of the structured document, therefore, it is necessary to read an unnecessary portion as a document, an amount of data to be transmitted increases, it takes time to read the data, and there is a problem such that a large memory area and a large disk capacity need to be assured.

SUMMARY OF THE INVENTION

According to the invention, there is provided a data compressing apparatus for shortening a time to retrieve or read a document and minimizing an increase in capacity of a memory or disk with respect to compression data of a structured document including tag information.

A target of the invention is a data compressing apparatus for forming code data from a character train stream constructed by a document including tags. According to the invention, the data compressing apparatus comprises: a tag information separating unit for separating an identified tag from a character train stream and outputting it as tag information; a tag code replacing unit for arranging a tag code for identification at a position in the character train stream from which the tag was separated by the tag information separating unit; and a character train coding unit for encoding the character train stream including the tag code outputted from the tag code replacing unit and outputting a code stream. According to the data compressing apparatus of the invention, the tag information and the text (character train) in the character train stream of the structured document including the tags are separated and at least the text is encoded, thereby realizing a high compression ratio. By retrieving the separated tag information, the retrieval can be performed at a high speed. For example, the tag information separated from the text in the compression data file is retrieved and when the coincident tag information can be retrieved, the data is skipped by the data of only the number of data up to the tag information at which the tag code in a reconstructed text has been retrieved, thereby enabling the laser beam to easily reach the head of the target document.

The tag code replacing unit arranges a predetermined fixed code as a tag code at the position in the character train stream from which the tag was separated. By using the fixed code as a tag code, the tag position in the text can be easily retrieved. The tag code replacing unit arranges the tag code indicative of the appearing order of the tags separated by the tag information separating unit at the position in the character train stream from which the tag was separated. By giving the information of the appearing order to the tag code, the retrieval of the text based on the tag information can be performed at a high speed and the reliability can be enhanced. The data compressing apparatus further comprises: a tag information storing unit for storing the tag information separated by the tag information separating unit; a code storing unit for storing code data formed by the character train coding unit; and a code switching unit for selecting the tag information stored in the tag information storing unit and the code data stored in the code storing unit and outputting the selected tag information or code data. By individually storing the separated tag information and the code data of the text, the retrieval of the compression data and the management for a transfer request can be easily performed.

The character train coding unit comprises: a dictionary storing unit for storing a dictionary in which a character train serving as a processing unit upon compression has been registered; and a character train comparing unit for comparing a partial character train in the character train stream from the tag code replacing unit with the registered character train in the dictionary storing unit to thereby detect the partial character train which coincides with the registered character train, allocating a predetermined code to each of the detected partial character trains, and outputting it. A coring process by the character train coding unit is effective in the compression of document data formed by character codes of a language having a word structure which is not separated by spaces. As a language having the word structure which is not separated by spaces, for example, there are Japanese, Chinese, Hangul, and the like. When considering Japanese as an example, there is a study result of Japan Electronic Dictionary Research Institute (EDR) Co., Ltd. regarding Japanese words (Yokoi, Kimura, Koizumi, and Miyoshi, "Information structure of electronic dictionary at surface layer level", the papers of Information Processing Society of Japan., Vol. 37, No. 3, pp. 333–344, 1996). In the study result, morphemes constructing Japanese, that is, parts of speech of words are added up. When words are simply classified into parts of speech class and the parts of speech class are registered, the number of parts of speech class is equal to 136,486 and they can be expressed by codes of 17 bits (maximum 262,143). The number of characters constructed every word of about 130,000 words constructing a Japanese word dictionary formed by Institute for New Generation Computer Technology (ICOT) is detected and a distribution of the words is obtained. Consequently, it has been found that each of the 70,000 words whose number is more than the half of all of the registered words is constructed by two characters and that the average number of characters is equal to 2.8 characters (44.8 bits). The dictionary storing unit forms and stores a dictionary in which a character train code of a fixed length of, for example, 17 bits is allocated to each word of, for example, about 130,000 words and which is practical as a dictionary of Japanese, retrieves a registration character train in the dictionary which coincides with the partial character train of the non-compression data, and allocates and outputs the fixed length code of 17 bits as a character train code, thereby enabling the data amount to be substantially compressed to ½ or less irrespective of the size of document data.

The data compressing apparatus of the invention has a tag information compressing unit for compressing the tag information separated by the tag information separating unit. The tag information includes a single tag and a combination of a tag and a character train. The tag information compressing unit compresses the tag information in a lump without distinguishing the tag and the character train. An algorithm such as LZ77, LZ78, arithmetic coding, or the like is used to perform the compression. The data compressing apparatus of the invention compresses the tag information by performing the same coding as that of the character train coding unit of the text to a character train of a language such as Japanese or the like which is not separated by spaces in the tag information. That is, the data compressing apparatus of the invention is characterized by comprising: a tag dictionary storing unit for storing a dictionary in which a tag character train in the tag information as a processing unit upon compression has been registered; and a tag character train comparing unit for comparing a partial character train in a character train stream included in the tag information separated by the tag information separating unit with a registered character in the tag dictionary storing unit to thereby detect the partial character train which coincides with the registered character train, allocating a predetermined code to each of the detected partial character trains, and outputting. By compressing the tag information separated as mentioned above, together with the compression of the text by the character train coding unit, the whole document file can be compressed at a high compression ratio.

The data compressing apparatus of the invention further has a tag position detecting unit for detecting a tag position in code data formed by the character train coding unit. Designation information of the tag position detected by the tag position detecting unit is stored in the tag information storing unit together with the tag information separated by the tag information separating unit. In this case, the tag position detecting unit detects a code amount from the head of a document or a specific tag and stores it together with the tag information into the tag information storing unit. Since a data amount (the number of bytes) from the document head indicative of the position of the corresponding tag code in the compressed text or a specific tag is stored as position designation information in the separated tag information, if the user wants to retrieve a necessary tag from the tag information, the position of a corresponding tag code in the compression data of the text can be immediately specified and random access of the required text can be efficiently performed.

According to the invention, there is provided a data reconstructing apparatus for reconstructing character train data from a code stream including tag information separated from a character train stream of a document including tags and code data obtained by encoding a character train stream in which a tag code has been arranged at a position of a separated tag.

The data reconstructing apparatus is characterized by comprising: a tag information separating unit for separating tag information and code data from a code stream; a tag information storing unit for storing the tag information separated by the tag information separating unit; and a character train reconstructing unit for reconstructing a character train and a tag code from the code data and, after that, replacing the tag code by the tag information in the tag information storing unit. The character train reconstructing unit executes the operation opposite to that of the character train coding unit and comprises: a dictionary storing unit for storing a dictionary in which a reconstruction character train corresponding to a code of a character train serving as a processing unit upon reconstruction has been registered; a character train comparing unit for separating the code of the character train as a reconstruction unit from the code stream and reconstructing the original character train by referring to the dictionary storing unit; and a character train replacing unit for replacing the tag code reconstructed by the character train comparing unit by the tag information in the tag information storing unit. If the tag information was compressed by LZ77, LZ78, or the like on the data compressing apparatus side, the data reconstructing apparatus of the invention has a tag information reconstructing unit for reconstructing compression data of the tag information stored in the tag information storing unit. If the character train of the tag information was encoded on the data compressing apparatus side, the data reconstructing apparatus of the invention comprises: a tag dictionary storing unit for storing a dictionary in which a reconstruction character train corresponding to a code of a tag character train serving as a processing unit upon reconstruction has been registered; and a tag character train comparing unit for separating the code of the tag character train as a reconstruction unit from the tag information separated by the tag information separating unit and reconstructing the original tag character train by referring to the tag dictionary storing unit. The invention further provides a compressing method and a reconstructing method of a structured document including tag information. A data compressing method of forming code data from a character train stream constructed by a document including tags according to the invention comprises:

a tag information separating step of separating a tag identified from a character train stream and outputting it as tag information;

a tag code replacing step of arranging a tag code for identification at a position in the character train stream from which the tag was separated in the tag information separating step; and a character train coding step of coding the character train stream including the tag code outputted in the tag code replacing step and outputting the code stream.

According to the invention, there is provided a data reconstruction method of reconstructing character train data from a code stream including tag information separated from a character train stream of a document including tags and code data obtained by coding the character train stream in which a tag code has been allocated at a position of the separated tag. The reconstructing method comprises:

a tag information separating step of separating tag information and code data;

a tag information storing step of storing the tag information separated in the tag information separating step; and a character train reconstructing step of reconstructing the character train and the tag code from the code data and, after that, replacing the tag information separated in the tag information storing step by the tag code. The details of the data compressing method and the reconstructing method are the same as those in the case of the apparatus.

The above and other objects, features, and advantages of the present invention will become more apparent from the following detailed description with reference to the drawings.

BRIEF DESCRIPTION OF THE DRAWINGS

FIG. 1 is an explanatory diagram of a structure of an SGML document;

FIG. 2 is an explanatory diagram of a specific example of a document type definition DTD of the SGML document;

FIG. 3 is an explanatory diagram of an SGML document file with respect to a Japanese document as an example;

FIG. 4 is a flowchart for a fundamental encoding algorithm to compress an SGML document file;

FIG. 5 is an explanatory diagram of an SGML document compression data file in which the portions of non-compressed tag information and the portion of a compressed text mixedly exist;

FIG. 6 is a block diagram of the first embodiment of a data compressing apparatus according to the invention;

FIG. 7 is a block diagram of a tag information separating unit in FIG. 6;

FIG. 8 is an explanatory diagram of a processing procedure of the data compressing apparatus in FIG. 6;

FIG. 9 is an explanatory diagram of a text file in which tags in FIG. 8 are replaced by tag codes;

FIG. 10 is an explanatory diagram of a tag information file separated from a character train stream in FIG. 8;

FIG. 11 is an explanatory diagram of a text file in which the tags in FIG. 8 are replaced by tag codes with an appearing order;

FIG. 13 is an explanatory diagram of a research result for a Japanese document;

FIGS. 15A and 15B are flowcharts for an encoding process in FIG. 6 using the dictionary structure in FIG. 14;

FIG. 21 is a block diagram of the third embodiment of a data compressing apparatus of the invention;

FIG. 25 is an explanatory diagram of a processing procedure of the data compressing apparatus in FIG. 24;

FIG. 26 is a flowchart for a data compressing process in FIG. 24;

DETAILED DESCRIPTION OF THE PREFERRED EMBODIMENTS

Figure 12:
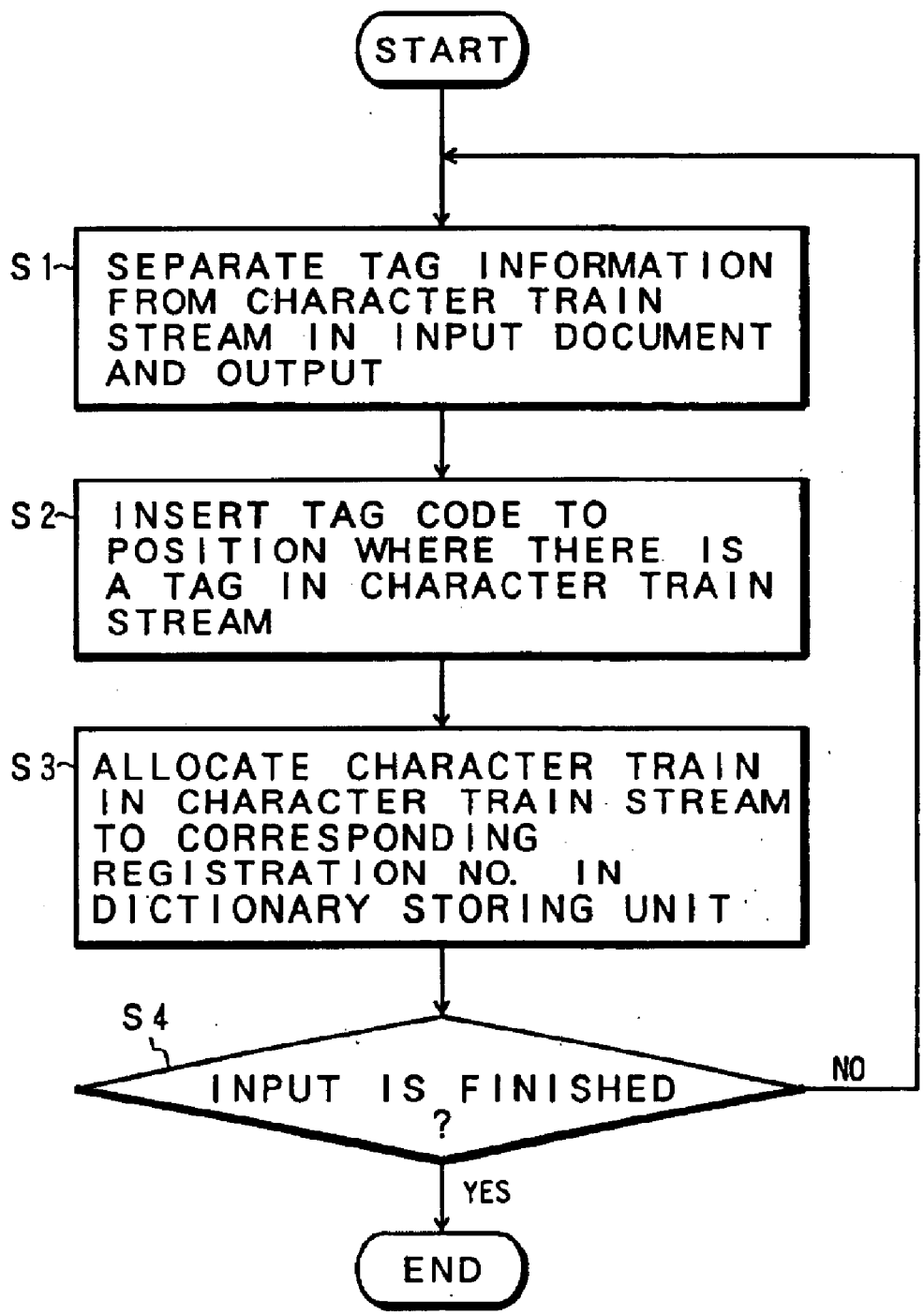
FIG. 12 is a flowchart for a compressing process of the data compressing apparatus in FIG. 6.

FIG. 6 is a block diagram of the first embodiment of a data compressing apparatus of the invention. The data compressing apparatus is constructed by a tag information separating unit 10, a tag code replacing unit 12, and a character train coding unit 14. The character train coding unit 14 has a character train comparing unit 16 and a dictionary storing unit 18. The tag information separating unit 10 inputs a character train stream 20 read out from, for example, an SGML Japanese document file shown in FIG. 3, discriminates tags included in the inputted character train stream 20, separates the discriminated tags, and outputs them as a tag information stream 28. The tag code replacing unit 12 arranges a predetermined tag code at a tag position of the character train stream from which tag information has been separated by the tag information separating unit 10, and supplies a character train stream 22 in which the tag codes have already been arranged to the character train coding unit 14. The character train coding unit 14 encodes the character train stream 22 including the tag codes arranged by the tag code replacing unit 12 and outputs a code stream 26.

FIG. 7 shows the details of the tag information separating unit 10 in FIG. 6 together with the tag code replacing unit 12. The tag information separating unit 10 is constructed by a tag comparing unit 30, a tag identification rule storing unit 32, and an output switching unit 34. An identification rule of the tag information obtained from a document type definition DTD in an SGML document has been stored in the tag identification rule storing unit 32. The tag comparing unit 30 inputs the character train stream 20 and compares it with the identification rule in the tag identification rule storing unit 32. When a comparison output is obtained by the tag information identification, the output switching unit 34 is switched from an output of character train stream 22 to an output of the tag information stream 28, and outputs the identified tag information as a tag information stream 28. At the same time, a comparison result based on the tag information identification is outputted to the tag code replacing unit 12. A tag code 24 which has been preset in the tag code replacing unit 12 is inserted and arranged from the output switching unit 34 to the position of tag information whose output has been stopped. For example, a hexadecimal fixed code "0x0000" is used as tag information 24 arranged at the position of the tag information of the character train stream 22 by the tag code replacing unit 12.

FIG. 8 is an explanatory diagram of a compressing process according to the data compressing apparatus in FIG. 6 with respect to the character train stream 20 read out from the SGML Japanese document file. An SGML Japanese document file 35 which is inputted as a character train stream 20 for the tag information separating unit 10 is compared with the tag identification rule stored in the tag identification rule storing unit 32 by the tag comparing unit 30 provided in the tag information separating unit 10 in FIG. 7. For example, the head "<TITLE>Specification of the Invention (Device)</TITLE>" is identified as tag information. This tag information is separated like a head position of a tag information file 36. In parallel with the separation of the tag information, a tag code using a hexadecimal fixed code "0x0000" is inserted and arranged to the position where the tag information in the SGML Japanese document file 35 has been separated. A character train stream of a tag-replaced Japanese document file 38 is formed by replacing the tag information by the tag code. The tag information stream serving as contents of the separated tag information file 36 is outputted as it is. The character train stream serving as contents of the tag-replaced Japanese document file 38 is encoded by the character train coding unit 14 and outputted as a code stream 26.

FIG. 9 shows the tag-replaced Japanese document file 38 obtained by inputting the character train stream 20 of the SGML Japanese document file in FIG. 3 to the data compressing apparatus in FIG. 6 and replacing the tag information by the fixed tag code by the tag code replacing unit 12. In the tag-replaced Japanese document file, the tag information in the SGML Japanese document file in FIG. 3 has been replaced by "(tag code)", respectively.

FIG. 10 shows the tag information file 36 of the tag information separated from the character train stream of the SGML Japanese document file shown in FIG. 3. The tag information included in the inputted character train stream is sequentially separated and stored in the tag information file 36. The tag-replaced character train stream 22 serving as contents of the tag-replaced Japanese document file 38 in FIG. 9 is encoded by the character train coding unit 14 in FIG. 6 and outputted as a compressed code stream 26.

FIG. 11 shows the tag-replaced Japanese document file 38 when order tag codes showing an appearing order of the tag information are used as tag codes. As order tag codes showing the appearance frequency of the tag information, it is sufficient to use, for example, hexadecimal order tag codes such as "0x001, 0x002, 0x003, . . ." which unconditionally correspond in accordance with the appearing order of the tags. In case of using the order tag codes indicative of the appearing order, as shown in FIG. 11, the tag codes themselves replaced in the Japanese character train data indicate the appearing order from the head of the document like "(tag code 1), (tag code 2), (tag code 3), . . . ". Therefore, when the position of the corresponding tag code in the document file in FIG. 11 is specified by searching the tag information separated as shown in FIG. 10, the searching position in the text can be easily and certainly specified. For example, if the user wants to know the position in the document file of the tag information "<SECTION> Scope of Claim </SECTION>" at line 5 in FIG. 10, since the tag identification information appears at the fifth line from the head, it can be easily specified by searching the position of "(tag code 5)" in which the appearing order is equal to No. 5.

FIG. 12 is a flowchart for a compressing process by the data compressing apparatus in FIG. 6. First in step S1, the tag information is separated from the character train stream 20 of the input document by the tag information separating unit 10 and outputted. In step S2, the tag code for identification is inserted to the position where the tag exists in the character train stream 20 of the input document by the tag code replacing unit 12. In step S3, the corresponding registration number in the dictionary storing unit 18 is allocated as a code to the character train in the tag-replaced character train stream by the character train comparing unit 16 provided in the character train coding unit 14, and the code stream 26 is outputted. The processes in steps S1 to S3 are repeated until the input of the character train stream is finished in step S4.

The coding process of the tag-replaced character train stream 22 by the character train comparing unit 16 and dictionary storing unit 18 provided in the character train coding unit 14 in FIG. 6 will now be described. The character train comparing unit 16 provided in the character train coding unit 14 in FIG. 6 performs the encoding to allocate a predetermined character train code to each character train constructing a word with reference to the dictionary storing unit 18. First, for example, Japanese document data will now be considered as document data as a target to be compressed in the character train comparing unit 16. In case of Japanese document data, one character is constructed by word data of two bytes and a word in the document has a structure such that it is not divided by spaces. The Japanese document data is inputted on a unit basis of a document which is used for compression of one time and a document of a proper size on the order of kilobyte to megabyte is inputted. The character train comparing unit 16 sequentially inputs the character trains of the Japanese document data from the head and detects whether they coincide with the registration character trains of a word unit which have previously been registered in the dictionary storing unit 18 or not. When the registration character train which coincides with the input character train is detected in the character train comparing unit 16, the character train code which has previously been registered in correspondence to the coincidence detected registration character train in the dictionary storing unit 18 is read out and allocated. This character train code is outputted.

The dictionary storing unit 18 to convert the character train of the Japanese document data into a character train code on a word unit basis will now be described. FIG. 13 is a sum result regarding parts of speech of morphemes constructing Japanese published by Japan Electronic Dictionary Research Institute (EDR) Co., Ltd. as a study result. According to the sum result, the number of morphemes corresponding to the number of words is equal to 136,486. When the number of words is expressed by binary numbers, they can be expressed by codes of 17 bits where the maximum number of expression items is equal to 262,143. On the other hand, as a result of obtaining a distribution by detecting the number of characters constructing the words from the Japanese dictionary having about 130,000 words formed by Institute for New Generation Computer Technology (ICOT), each of 70,000 words which are equal to or larger than ½ of all of the registered words is constructed by two characters and the average number of characters is equal to 2.8 characters. When the average number of characters (2.8 characters) is expressed by the number of bits, it is equal to $$2.8 \text{ characters} \times 2 \text{ bytes} = 5.6 \text{ bytes} \times 8 \text{ bits}$$
$$= 44.8 \text{ bits}$$

According to the invention, by executing a coding such that a character train code of 17 bits expressing each of the 136,486 words in FIG. 13 is preliminarily allocated and the character train of the inputted Japanese data is converted to the character train code of 17 bits on a word unit basis, the data amount can be substantially compressed to the half or less.

Figure 14:
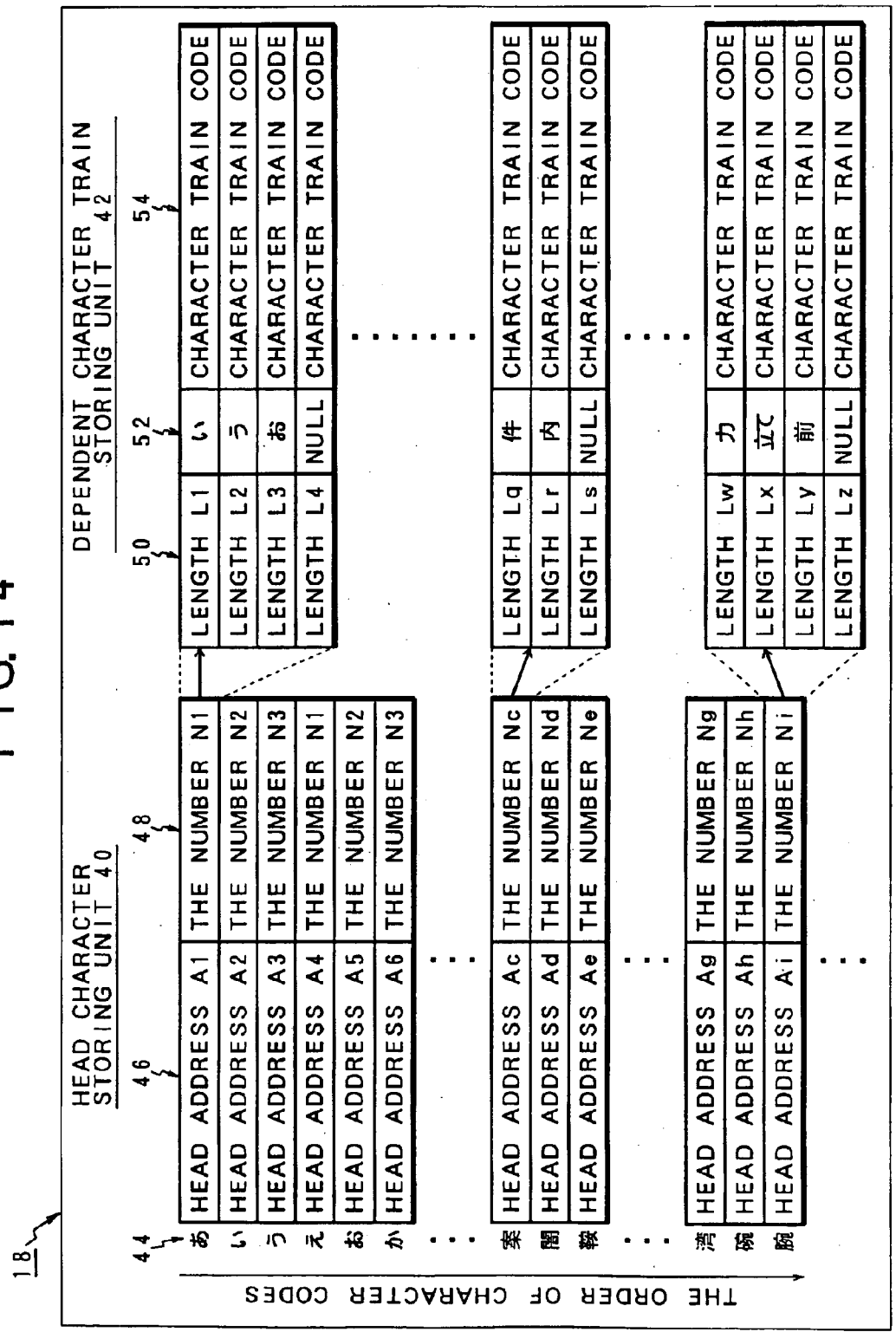
FIG. 14 is an explanatory diagram of a dictionary structure of a dictionary storing unit in FIG. 6.

FIG. 14 shows an embodiment of a dictionary structure of the dictionary storing unit 18 in FIG. 6. The dictionary stored in the dictionary storing unit 18 in FIG. 6 has a double-layer structure of a head character storing unit 40 and a dependent character train storing unit 42. The head character storing unit 40 uses character codes of Japanese characters "あ, い, う, え, お, . . . (which pronounce a, i, u, e, o, . . . in the Roman alphabets)" as indices. Since the Japanese character code is two-byte data, as character codes 44, 131,072 kinds of storing positions from "0x0000" to "0xFFFF" as hexadecimal numbers are allocated. The character code 44 accesses to the position of the corresponding character code by using the head character read by the character train comparing unit 16 in FIG. 6. A head address 46 is stored after the character code 44. When the head character "あ (a)" of the character code 44 is taken as an example, the head address 46 designates a head address "A1" in the dependent character train storing unit 42 in which the dependent character train subsequent to the head character "あ (a)" has been stored. Subsequently, the number of dependent character trains (48) is provided. For example, in case of the head character "あ (a)", (N1=4) is stored as the number of dependent character trains (48). In the dependent character train storing unit 42, the head position is designated by the head address 46 stored in correspondence to the character code 44 of the head character in the head character storing unit 40 and the dependent character trains are stored at the storing positions of the number designated by the dependent character train storing unit 42 from the head position. For example, four storing positions when the number of dependent character trains (48) is (N1=4) are designated as dependent character train storing regions as targets from the address A1 of the head address 46 corresponding to the head character "あ (a)". In the dependent character train storing unit 42, a length 50 of dependent character train from the head, a dependent character train 52, and a character train code 54 which is expressed by 17 bits are stored. In the head address A1, for instance, a dependent character train "い (i)" having a length of L1 and its character train code are stored. A dependent character train "う (u)" having a length L2 is stored together with its character train code at the next storing position. In the third region, a dependent character train "お (o)" having a length L3 is stored together with its character train code. In the fourth storing region, a code "NULL" indicating that a dependent character train having a length L4 does not exist is stored and a character train code indicative of the absence is stored. That is, the fourth storing region shows registration of the character train code of only one head character. "あ い う え お か . . . 家 閑 鞐 . . . 椀 椀 腕" of the head character codes 24 in FIG. 5 and "い う え . . . 件 内 . . . 力 立て 前 . . ." of the dependent character trains 32 are examples of Japanese characters each expressed by a 2-byte code and are expressed by the Roman alphabets as "あ (a), い (i), う (u), え (e), お (o), か (ka) . . . 家 (an), 閑 (an), 鞐 (an), . . . , 椀 (wan), 椀 (wan)" and "い (i), う (u), お (o), . . . , 件 (ken), 内 (nai), . . . , 力 (chikara), 立て (tate), 前 (mae) . . . ".

The first to 136,486th character train codes of 17 bits have preliminarily been allocated as character train codes 54 in the dependent character train storing unit 42 in FIG. 14 on the basis of the number of words and the relation between a character train code K and a position address X in case of storing as shown in FIG. 14 can be expressed by the following equation.

$$K = (N \cdot X - A1)/M \quad (1)$$

where, X: position address in the dependent character train storing unit 42

N: number (1, 2, 3, . . . , N) of the dependent character train in which the coincidence has been detected A1: start address in the dependent character train storing unit M: storage byte length in the dependent character train storing unit Since the storage byte length (M) in the dependent character train storing unit 42 is equal to the total length of the length 50 of dependent character train, dependent character train 52, and character train code 54, it can be expressed by, for example, the following equation.

$$\begin{aligned}
\text{Storage byte length M} &= \text{length} + \text{character code train} + \text{character train code} \\
&= 3 \text{ bits} + 96 \text{ bits} + 17 \text{ bits} \\
&= 116 \text{ bits} \\
&= 15 \text{ bytes}
\end{aligned} \quad (2)$$

A case of allocating 96 bits to the dependent character train 52 by setting the maximum number of characters of the dependent character train which can be stored to six characters is shown here as an example. It will be obviously understood that since the average number of characters of the dependent character train is equal to 2.8 characters, if the maximum number of characters is set to three characters (48 bits) or larger, a sufficient compressing effect can be obtained. In this case, the storage byte length (M) of one storing region in the dependent character train storing unit is equal to 12 bytes. When the character train code (K) of 17 bits which is calculated by the equation (1) is used, it is sufficient to calculate the storing position (address) X from the value of the character train code (K) by the following equation at the time of reconstruction.

$$X = M \cdot K + A1 \quad (3)$$

where, K: character train code

A1: start address in the dependent character train storing unit

M: storage byte length in the dependent character train storing unit on the reconstruction side In the equation (3), since the start address A1 in the dependent character train storing unit 42 in the dictionary which is used on the reconstruction side, that is, an offset and the storage byte length (M) of the dependent character train storing unit 42 have been determined as constants, by substituting the character train code (K) to be reconstructed into the equation (3), the dictionary position (position address) X in which the character train to be reconstructed has been stored can be unconditionally calculated.

Figure 15A:
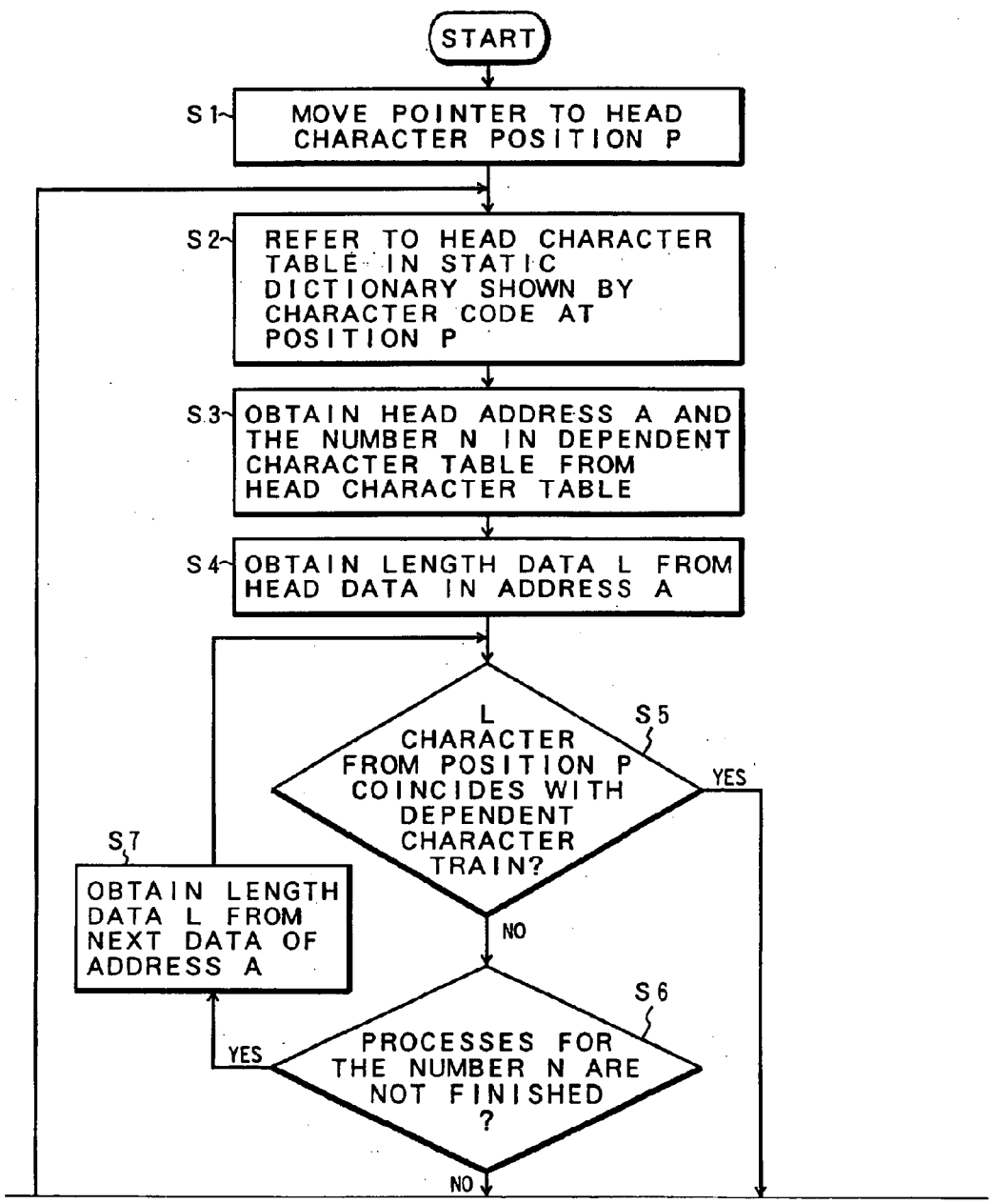

FIGS. 15A and 15B are flowcharts for the encoding process by the character train comparing unit 16 in FIG. 6 by the dictionary storing unit 18 having the dictionary structure of FIG. 14. First, in step S1, a pointer is moved to a position P of the head character of the character train read to the character train comparing unit 16. A table in the head character storing unit 40 corresponding to the character code 44 in FIG. 14 shown by the character code at the head character position P is referred to in step S2. With reference to the table in the head character storing unit 40, the head address 46 and the number of dependent character trains (48) in the dependent character train storing unit 42 are obtained in step S3. Subsequently, in step S4, length data L of the length 50 of dependent character train is obtained from the head data in the head address in the dependent character train storing unit 42. In step S5, L characters based on the length data L of the dependent character train are extracted from the head character position P, the extracted L characters are compared with the registration character train of the dependent character train 52 in the dependent character train storing unit 42, thereby discriminating whether they coincide or not. When the extracted L characters coincide with the registered dependent character train, the processing routine advances to step S8, the next character train code 54 is read out and is allocated to the coincidence detected character train by the character train comparing unit 16, and the resultant character train is outputted. In step S9, the pointer at the head character position P is updated to the position P where it is moved by only the number L of characters of the dependent character train. If a process for non-compression data is not finished in step S12, the processing routine is again returned to step S2 and similar processes are repeated with respect to the updated head character position P. On the other hand, when the extracted character does not coincide with the registration dependent character train in the dependent character train storing unit 42 in step S5, a check is made to see whether the process to the number (N) of dependent character trains has been finished or not. If it is not finished yet, the processing routine is returned to step S7. The length data L of the dependent character train is obtained from the next storing region in the head address in the dependent character train storing unit 42. The dependent character train of the L characters is extracted again from the head character position P in step S5 and is compared with the registration dependent character train in the dependent character train storing unit 42 to see whether they coincide or not. In a case where they do not coincide even when the comparing process is performed with respect to all of the dependent character trains of the registration number (N) by repetition of steps S5 to S7, the end of the number (N) of dependent character trains is discriminated in step S6. The processing routine advances to step S10 and a non-registered code indicative of one character of the head character is transmitted. In step S11, the pointer is updated to a next position where the head character position P has been moved only by the number (L) of characters (L=1). The processing routine is returned from step S12 to step S2 and the processes from the next head character position P are repeated.

Figure 16:
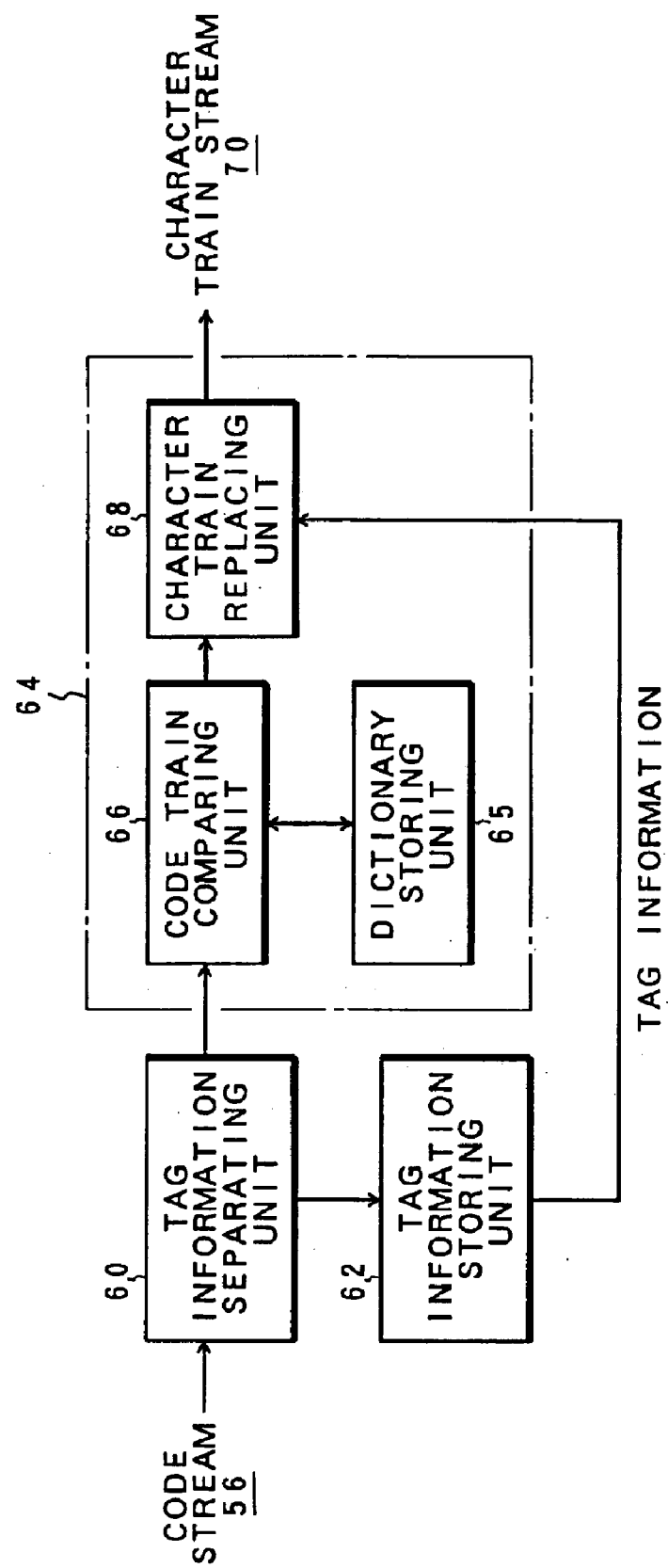
FIG. 16 is a block diagram of the first embodiment of a data reconstructing apparatus of the invention for reconstructing a code stream from the data compressing apparatus in FIG. 6.

FIG. 16 is a block diagram of the first embodiment of a data reconstructing apparatus for reconstructing a character train stream from the code stream which is outputted from the data compressing apparatus in FIG. 6 and constructed by the code stream 26 and tag information stream 28. The data reconstructing apparatus comprises a tag information separating unit 60, a tag information storing unit 62, and a character train reconstructing unit 64. The character train reconstructing unit 64 has a code train comparing unit 66, a dictionary storing unit 65, and a character train replacing unit 68. The tag information separating unit 60 inputs a code stream 56 sent from the data compressing apparatus side in FIG. 6 and separates it into the tag information and the code data. The tag information is stored into the tag information storing unit 62. The code data is outputted as a code stream 56 to the character train reconstructing unit 64. The character train reconstructing unit 64 reconstructs the character train and the tag code from the code data in the code train comparing unit 66 by using the dictionary storing unit 65. After that, in the character train replacing unit 68, the tag code is replaced by the tag information stored in the tag information storing unit 62 and a reconstructed character train stream 70 is outputted.

Figure 17:
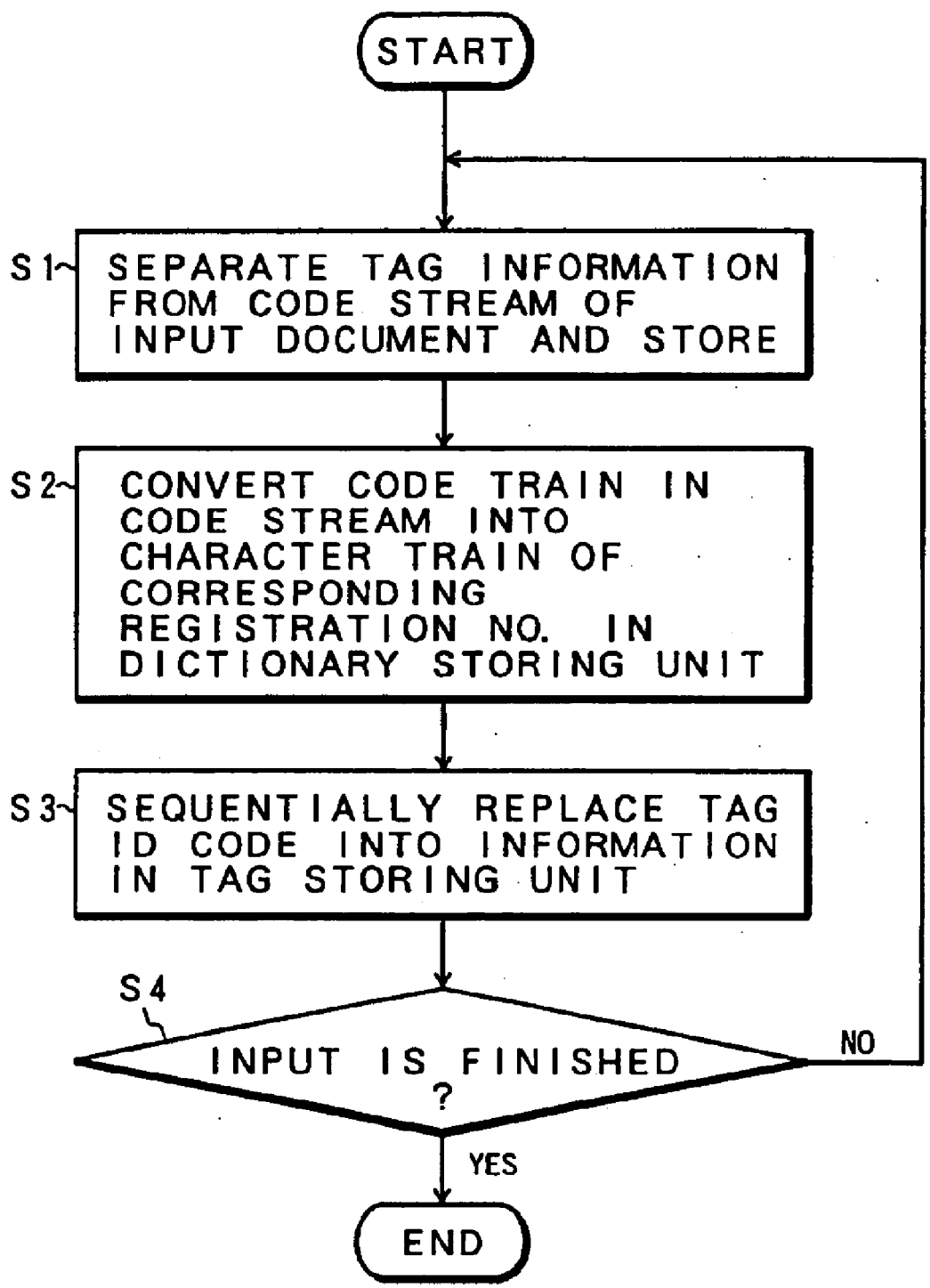
FIG. 17 is an explanatory diagram of a dictionary structure of a dictionary storing unit in FIG. 16.

FIG. 17 is a flowchart for the reconstructing process of the data reconstructing apparatus in FIG. 16. First in step S1, the tag information separating unit 60 separates the tag information from the code stream 56 corresponding to the input document and stores it into the tag information storing unit 62. In step S2, the code train in the code stream 56 from which the tag information has been separated is compared and collated with the registration number in the dictionary storing unit 65 and converted into the character or character train stored by the coincident registration number. In step S3, the tag codes included in the reconstructed character train are sequentially replaced in accordance with the storing order of the tag information stored in the tag information storing unit 62 and outputted as a reconstructed character train stream 70. The processes in steps S1 to S3 are repeated until the input of the code stream 56 is finished in step S4. With reference to the dictionary storing unit 65, the code train comparing unit 66 provided in the character train reconstructing unit 64 in FIG. 16 reconstructs the original character train from the code train stream encoded by the data compressing apparatus in FIG. 6.

Figure 18:
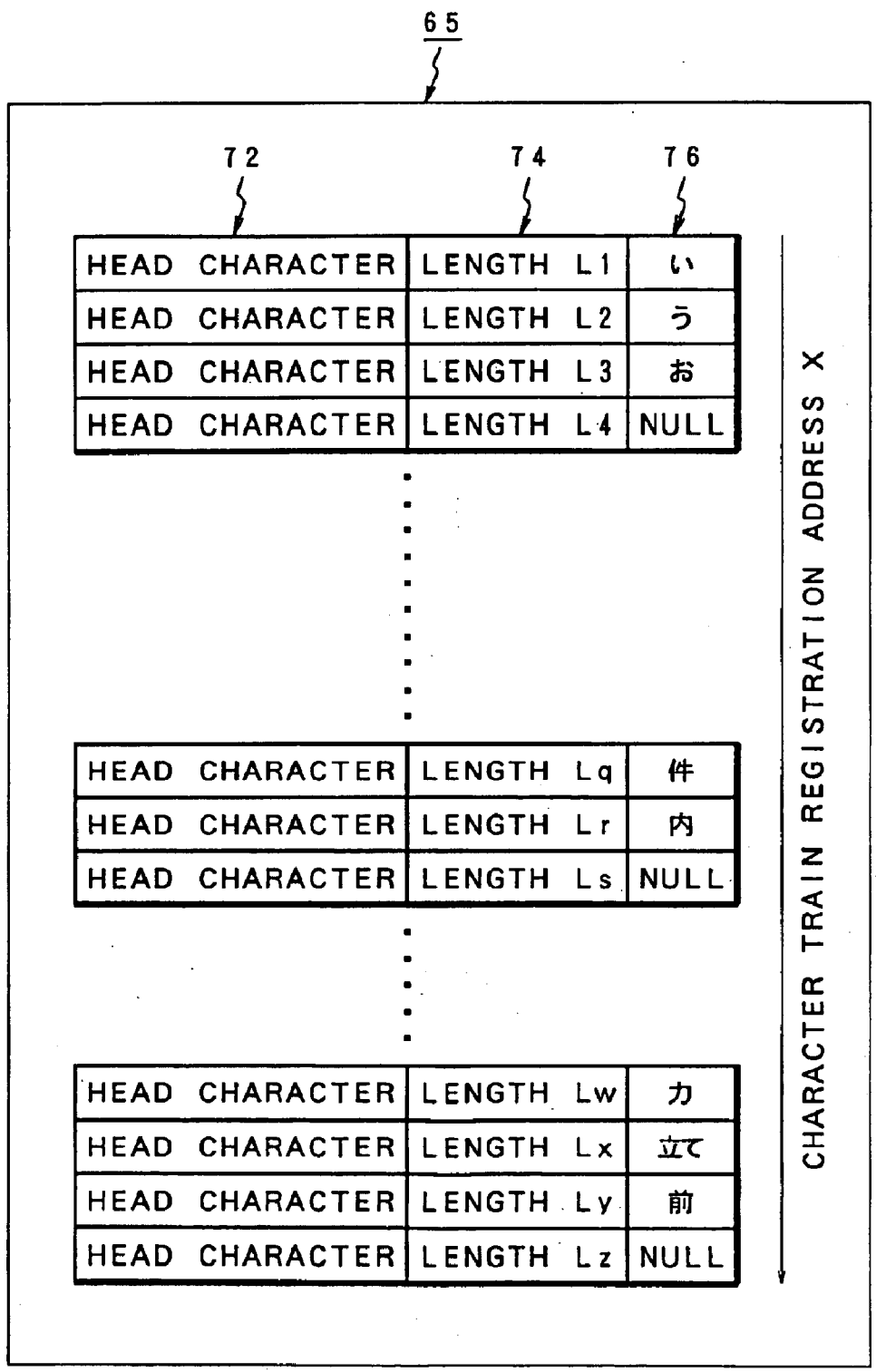
FIG. 18 is a flowchart for a reconstructing process of the data reconstructing apparatus in FIG. 16.

FIG. 18 shows a dictionary structure of the character train dictionary storing unit 65 in FIG. 16. In the character train dictionary storing unit 65, a head character 72, a dependent character train length 74, and a dependent character train 76 have been stored in accordance with the order of the character train code 54 of 17 bits in the dependent character train storing unit 42 shown in the dictionary structure in FIG. 14. Therefore, in the code train comparing unit 66, since the storage byte length M of the dependent character train storing unit 42 which is used for reconstruction has been known from $$\text{storage byte length M=head character+length+character code train=16 bits+3 bits+96 bits=115 bits=15 bytes,} \quad (6)$$

the position address X corresponding to the character train code K can be calculated from the following equation.

$$X = M \cdot K + A1 \quad (7)$$

where, K: character train code
A1: start address of character train storing position
M: storage byte length By obtaining and referring to the position address X showing the dictionary storing position from the separated character train code K as mentioned above, the character train comprising a combination of the corresponding head character and dependent character train can be reconstructed.

By the data compressing apparatus of FIG. 6 and the data reconstructing apparatus of FIG. 16 as mentioned above, the character train stream of the SGML Japanese document file shown in FIG. 3 is separated into the tag information as shown in FIG. 10 and the character train stream in which the tag information is replaced by the tag code as shown in FIG. 9. In the embodiment, by encoding the character train stream which has already been replaced to the tag code, the portion corresponding to the text of the document file can be converted into a compression file of a high compression ratio. The tag information separated as shown in FIG. 10 is retrieved by using a keyword and if the tag information which coincides with the keyword is obtained, to which number the appearing position of the tag information corresponds is detected. Thus, by retrieving the appearing position of the tag code included in the document file of the tag code-replaced text in FIG. 9, the reading operation by specifying the document position corresponding to the retrieval result of the tag information or the like can be easily performed.

Figure 19:
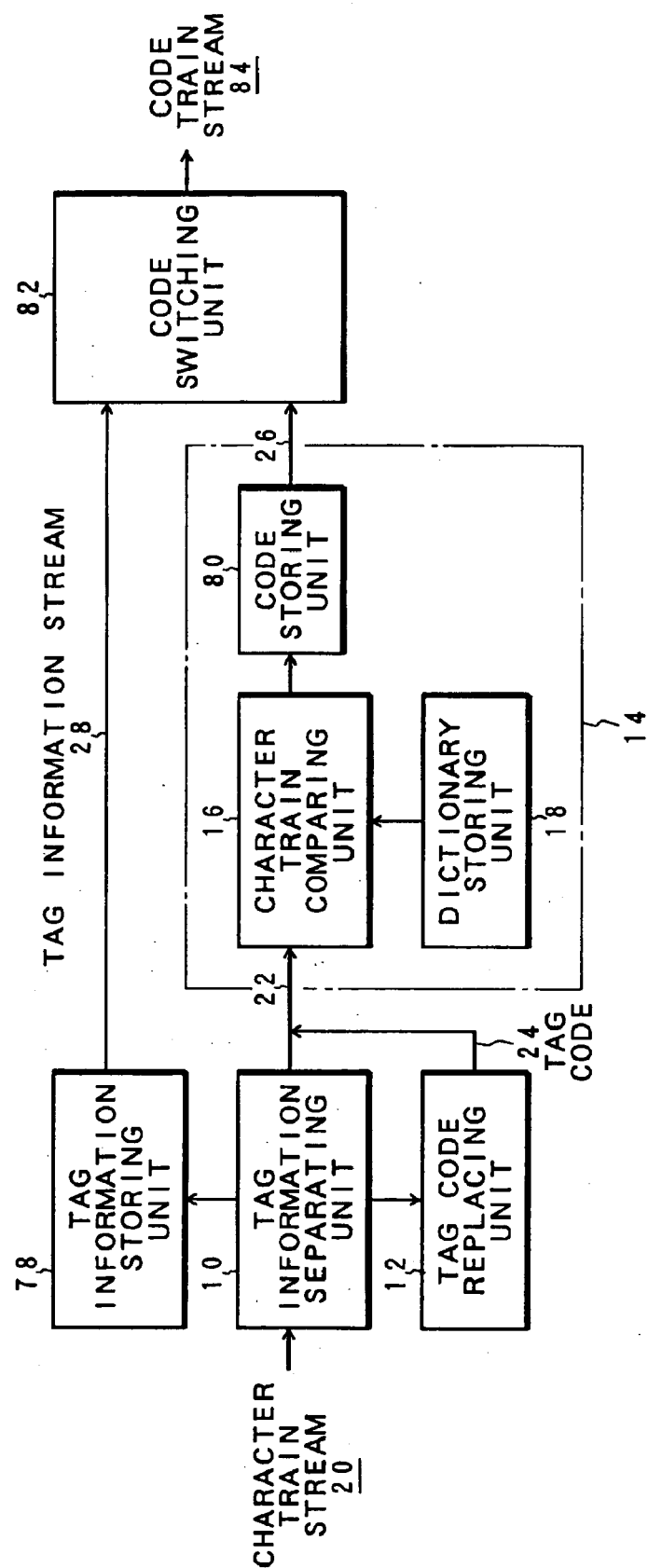
FIG. 19 is a block diagram of the second embodiment of a data compressing apparatus of the invention.

FIG. 19 shows the second embodiment of a data compressing apparatus of the invention. The embodiment is characterized by providing a tag information storing unit 78 and a code storing unit 80 in addition to the first embodiment of FIG. 6. The tag information separated from the character train stream 20 by the tag information separating unit 10 is stored into the tag information storing unit 78. Thus, for example, the tag information file 36 as shown in FIG. 10 is stored into the tag information storing unit 78. The code storing unit 80 is provided in the character train coding unit 14. The code data formed by the coding process in FIG. 15 is stored into the code storing unit 80 with respect to the tag-replaced character train stream 22 obtained by inserting the tag information into the tag information separated by the tag code replacing unit 12. Besides the tag information storing unit 78 and code storing unit 80, a code switching unit 82 is provided at the output stage. The code switching unit 82, for example, sequentially selects the tag information stored in the tag information storing unit 78 and the code data stored in the code storing unit 80 and outputs them as a code train stream 84.

Figure 20:
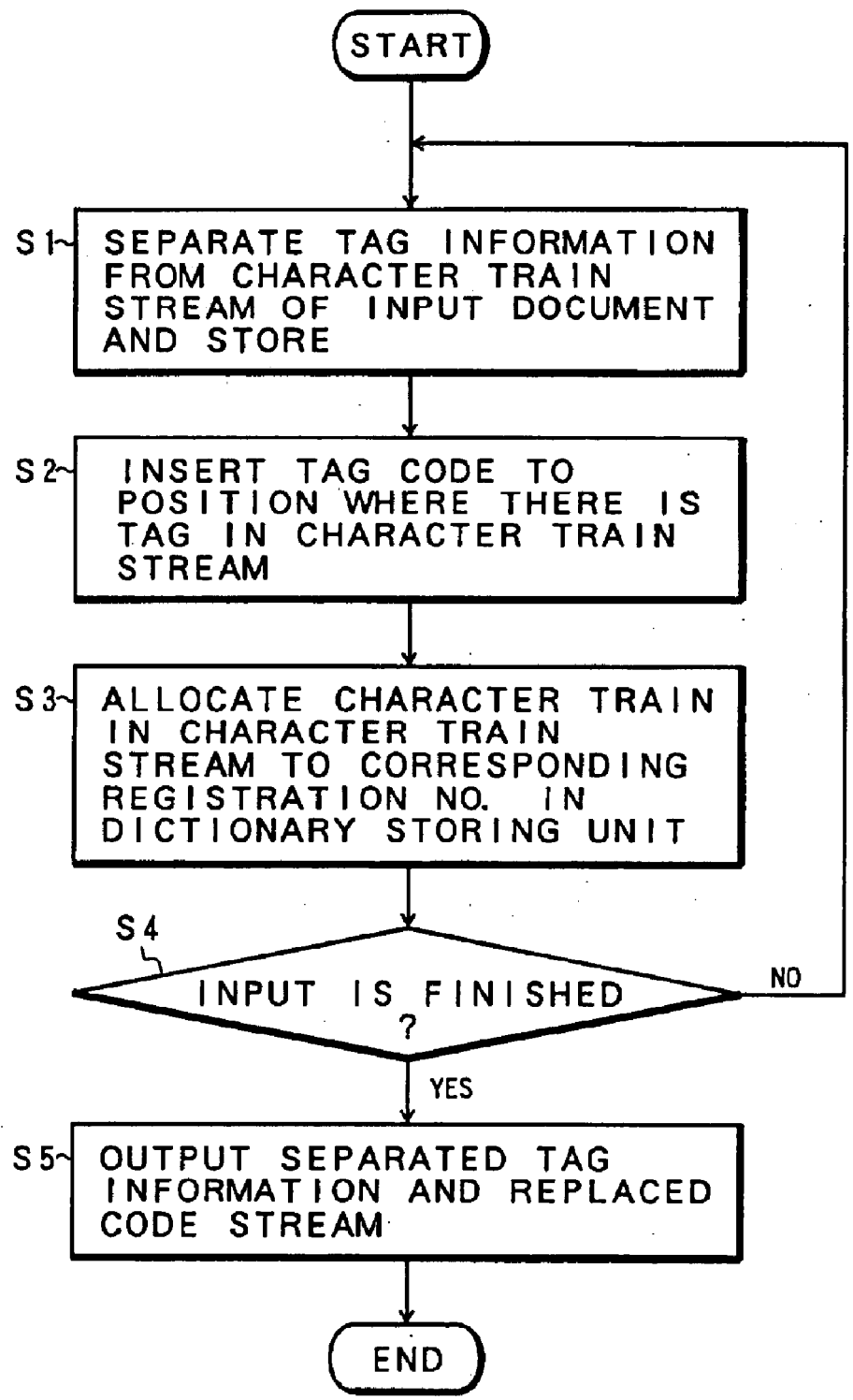
FIG. 20 is a flowchart for a compressing process of the data compressing apparatus in FIG. 19.

FIG. 20 is a flowchart for a compressing process of the data compressing apparatus of FIG. 19. In the compressing process, in step S1, the tag information is separated from the character train steam 20 of the input document by the tag information separating unit 10 and stored into the tag information storing unit 78. In step S2, a tag code for identification is inserted to a position where the tag exists in the character train stream 20 by the tag code replacing unit 12. In step S3, the character train of the character train stream 22 after completion of the replacement of the tag code is inputted to the character train comparing unit 16 of the character train coding unit 14 and converted into the corresponding registration number of the dictionary structure in the dictionary storing unit 18. The processes in steps S1 to S3 as mentioned above are repeated until the input of the character train stream is finished in step S4. When the input of the character train stream is finished, step S5 follows. The code streams encoded by converting into the separated tag information and tag code are sequentially read out from, for example, the tag information storing unit 78 and code storing unit 80 and outputted as a code train stream 84. By inputting the code train stream 84 outputted from the data compressing apparatus in FIG. 19 to the data reconstructing apparatus shown in FIG. 16, the character train stream can be reconstructed.

Figure 22:
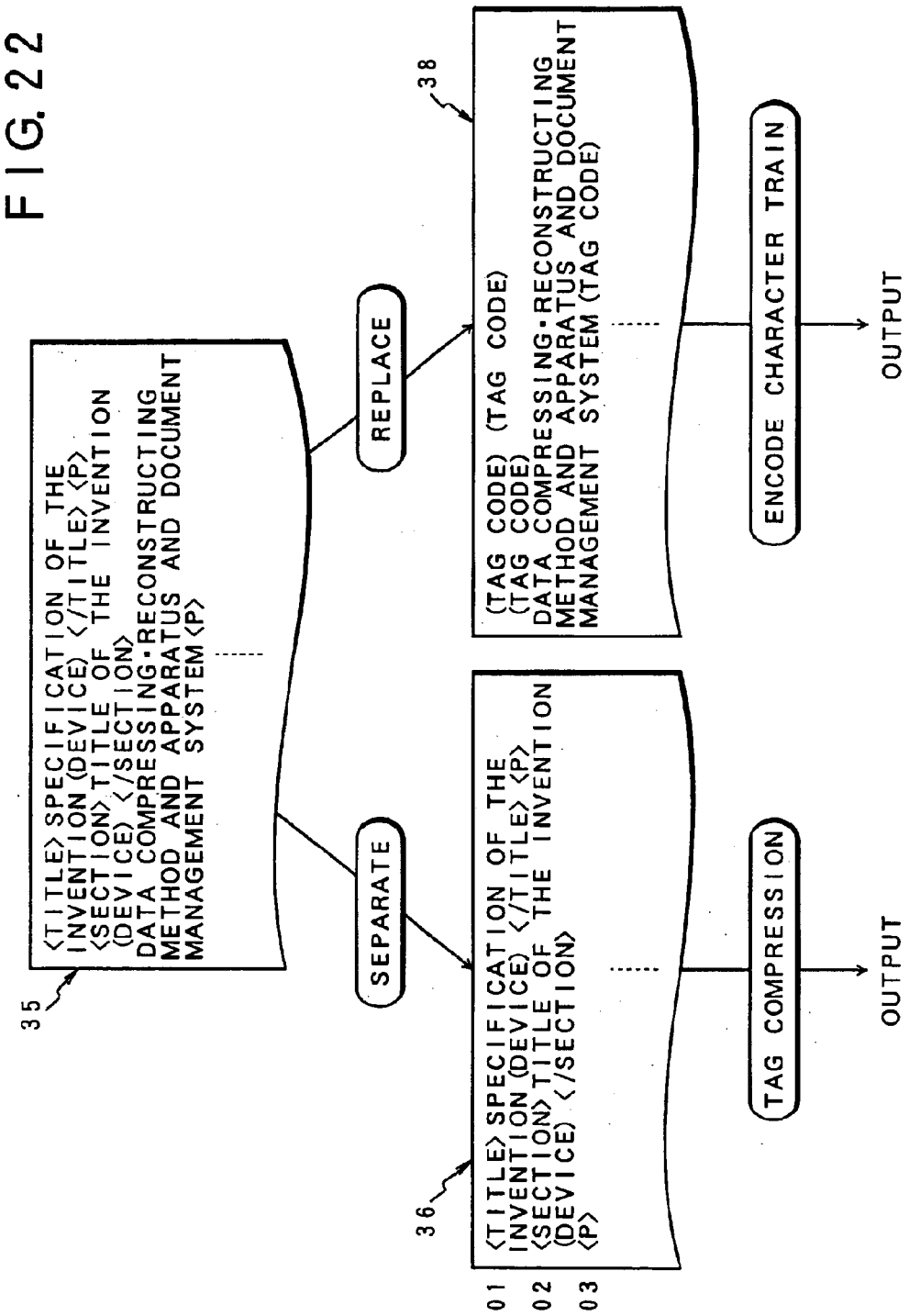
FIG. 22 is an explanatory diagram of a processing procedure of the data compressing apparatus in FIG. 21.

FIG. 21 shows the third embodiment of a data compressing apparatus of the invention. The embodiment is characterized in that the tag information separated from the character train stream is compressed. In the data compressing apparatus, a tag information compressing unit 86 is newly provided between the tag information separating unit 10 and tag information storing unit 78 in the second embodiment in FIG. 19. The tag information compressing unit 86 compresses the tag information inputted and separated from the character train stream 20 by the tag information separating unit 10 as a character train stream as a target of the compression and stores it into the tag information storing unit 78. As for the compressing process by the tag information compressing unit 86, a compression algorithm such as LZ77, LZ78, arithmetic encoding, or the like is used since the tags and the Japanese character train are included in the tag information and they are compressed in a lump. The tag information separating unit 10, tag code replacing unit 12, and character train coding unit 14 are the same as those in the second embodiment of FIG. 19. FIG. 22 is an explanatory diagram of the compressing process by the data compressing apparatus of FIG. 21. The character train stream 20 serving as contents of the SGML Japanese document file 35 is separated into the tag information serving as contents of the tag information file 36 by the tag information separating unit 10. After the tag information was compressed by the tag information compressing unit 86, it is outputted via the storage of the tag information storing unit 78. A fixed tag code or an order tag code indicative of the appearing order is inserted and arranged by the tag code replacing unit 12 to the position of the tag information separated from the character train stream 20 serving as contents of the SGML Japanese document file 35. The character train stream 22 serving as contents of the tag-replaced Japanese document file 38 is outputted to the character train coding unit 14. The code data compressed by the character train encoding is outputted via the storage by the code storing unit 80.

Figure 23:
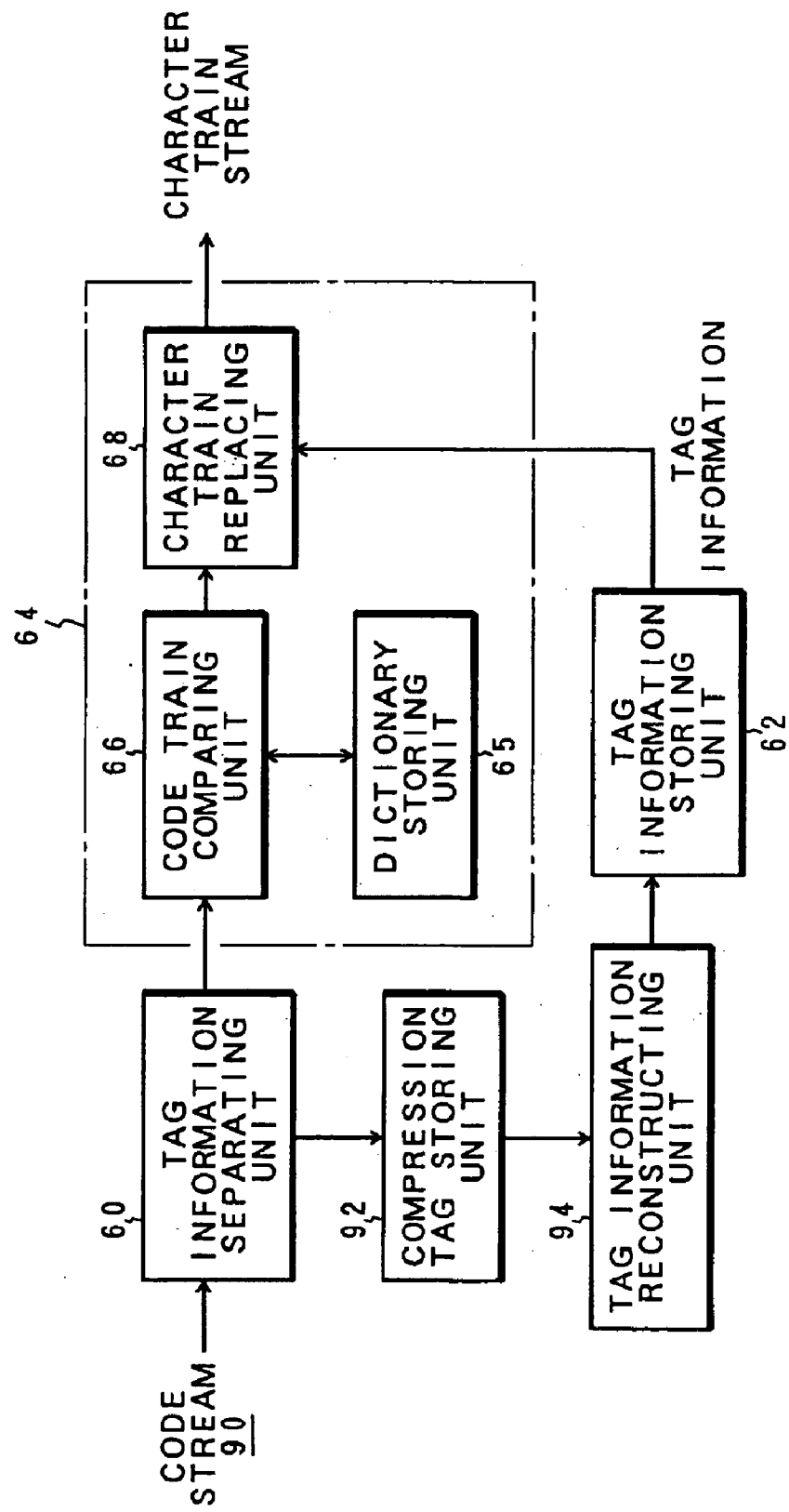
FIG. 23 is a block diagram of the second embodiment of a data reconstructing apparatus of the invention for reconstructing a code stream from the data compressing apparatus in FIG. 21.

FIG. 23 shows the second embodiment of a data reconstructing apparatus of the invention for reconstructing a character train stream from a code stream 90 outputted from the data compressing apparatus in FIG. 21. The data reconstructing apparatus further has a compression tag storing unit 92 and a tag information reconstructing unit 94 in addition to the first embodiment of FIG. 16. The tag information separating unit 60 separates the compression tag information included in the code stream 90 which is inputted and stores the separated compression tag information into the compression tag storing unit 92. The compression tag information stored in the compression tag storing unit 92 is reconstructed by the tag information reconstructing unit 94 and stored into the tag information storing unit 62. The tag information reconstructing unit 94 executes a reconstruction algorithm corresponding to LZ77, LZ78, or arithmetic decoding on the data compression side. The other construction is substantially the same as that in FIG. 19.

Figure 24:
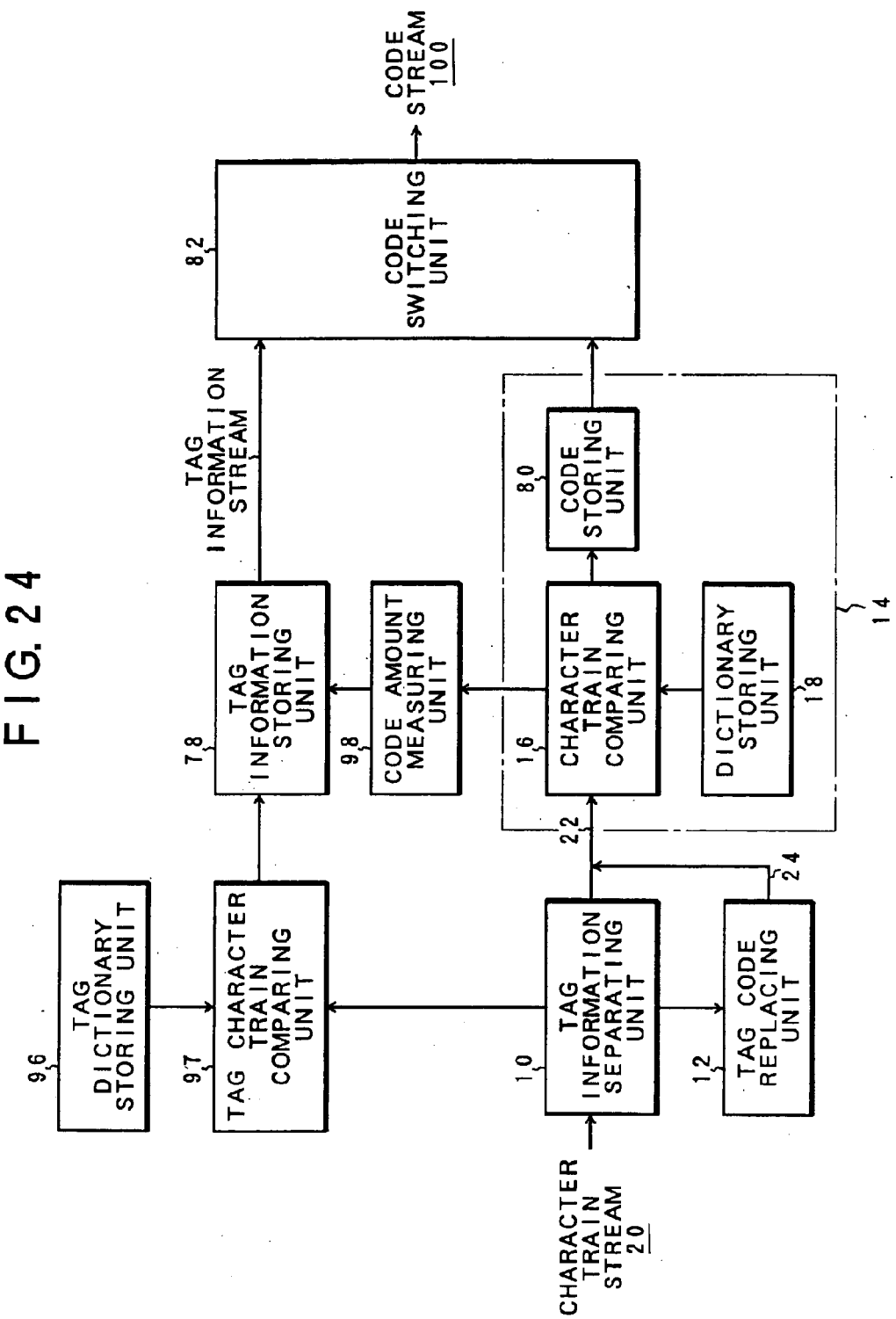
FIG. 24 is a block diagram of the forth embodiment of the data compressing apparatus of the invention.

FIG. 24 shows the fourth embodiment of a data compressing apparatus of the invention. The embodiment is characterized in that the Japanese character train in the separated tag information is compressed by encoding and, further, position designation information indicative of the position of the replaced tag code in the text is added to the separated tag information. In the fourth embodiment, the tag information separating unit 10, the tag code replacing unit 12, the character train coding unit 14 having the character train comparing unit 16 and dictionary storing unit 18, the tag information storing unit 78, and the code switching unit 82 are substantially the same as those in the second embodiment of FIG. 19. Besides them, a tag character train comparing unit 97, a tag dictionary storing unit 96, and a code amount measuring unit 98 are newly provided. In the tag character train comparing unit 97 and tag dictionary storing unit 96, the Japanese character train stream included in the tag information separated by the tag information separating unit 10 is encoded by a coding algorithm similar to that in the character train coding unit 14, thereby compressing the tag information. Therefore, a dictionary structure in the tag information storing unit 78 is the same as that in FIG. 14 and the Japanese character train which is used in the tag information is used as a head character and dependent characters. The coding process of the tag character train is performed in accordance with the flowcharts of FIGS. 15A and 15B. The code amount measuring unit 98 provided in the data compressing apparatus measures a code amount in a range from the head of the character train stream to each replaced tag code with respect to the code data due to the encoding with regard to the character train stream 22 of the text by the character train coding unit 14, namely, the character train stream 22 in which the replacement of the tag code was finished as a target. The code amount measuring unit 98 adds a measurement result of the code amount to each tag code as code position information to each of the tag information separated from the character train stream to be stored into the tag information storing unit 78 and stores it. As position designation information indicative of the position of the tag information replaced by the tag code by the code amount measuring unit 98, besides the code amount from the head of the character train stream, a code amount of the code data in a range from specific tag information in the character train stream to each subsequent tag information can be used.

FIG. 25 is an explanatory diagram of a compressing process in the fourth embodiment of FIG. 24. The processes such that the character train stream serving as contents of the SGML Japanese document file 35 is inputted, the tag information file 36 by the separation of the tag information is formed, and the tag-replaced Japanese document file 38 in which the tag information was replaced by the tag code is formed are substantially the same as those in the second embodiment of FIG. 19. Besides them, a tag character train as a Japanese character train included in the tag information in the separated tag information file 36 is encoded and compressed by using the tag dictionary storing unit 96, thereby outputting.

FIG. 26 shows a specific example of the tag information file stored in the tag information storing unit 78 and relates to the tag information, as an example, separated from the SGML Japanese document file shown in FIG. 3. Code amounts (byte amounts) DL1 to DL13 from the head of the code data of the character train data in the tag-replaced Japanese file 38 in FIG. 25 have been stored as position designation information 106 on the right side in the tag information file 36 in correspondence to each tag corresponding to indices 01 to 13 on the left side, respectively.

Figure 27:
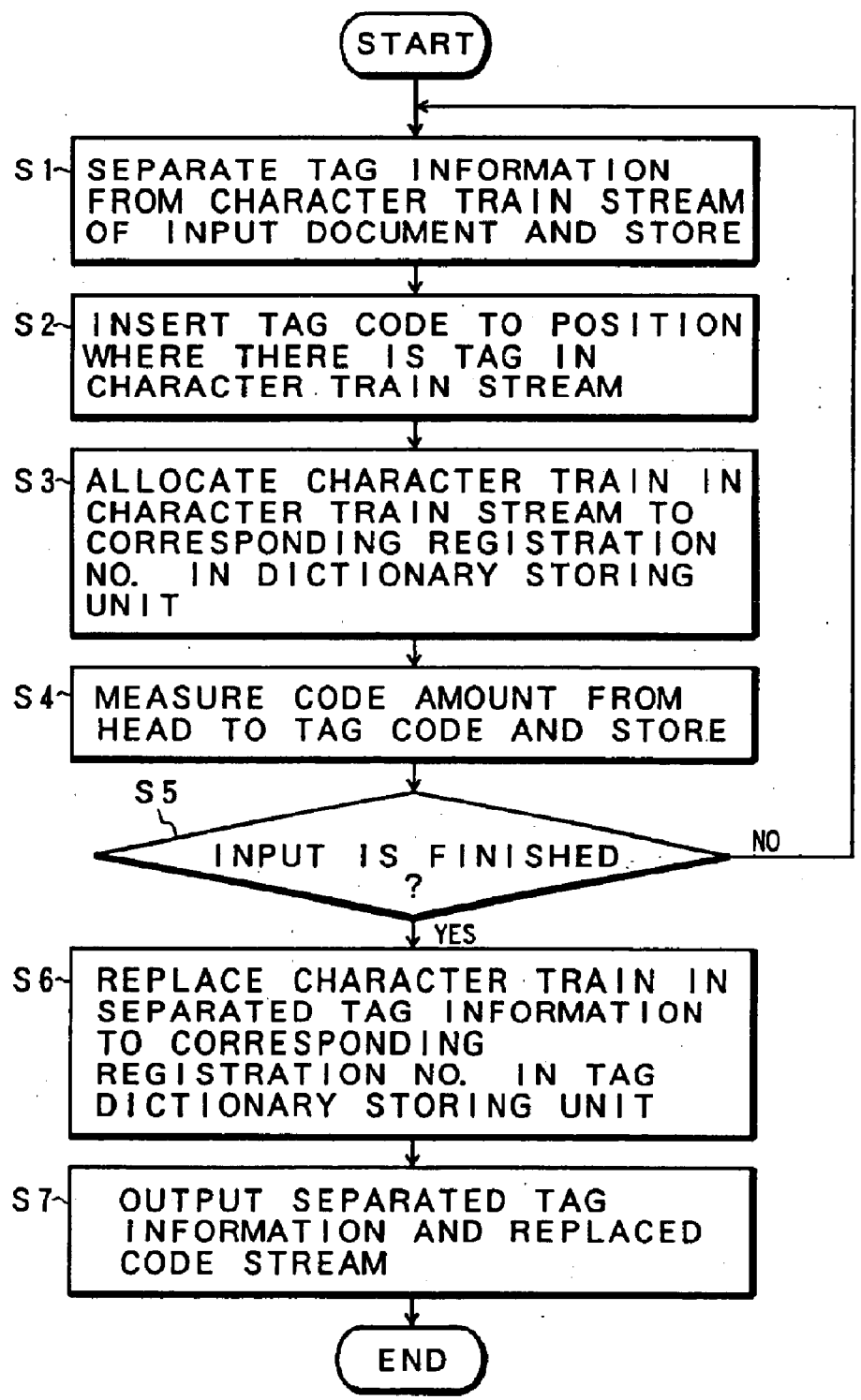
FIG. 27 is an explanatory diagram of a tag information file and a tag information stream which are stored in the data compressing apparatus in FIG. 24 in which a code amount in FIG. 25 has been added to tags.

FIG. 27 is a flowchart for the compressing process according to the fourth embodiment of FIG. 24. First, steps S1 to S4 are the same as those in FIG. 12. The tag information separated from the character train stream 20 by the tag information separating unit 10 is stored into the tag information storing unit 78. The character train stream 22 in which the tag code 24 has been inserted and arranged to the position of the tag information separated by the tag code replacing unit 12 is encoded by the character train coding unit 14. The code data is stored into the code storing unit 80. In step S4, when the replaced tag code is encoded by the character train coding unit 14, the code amount measuring unit 98 measures, for example, a code amount DL from the head of the character train stream. The measured code amount DL is stored as position designation information 106 in FIG. 26 into the tag information already stored in the tag information storing unit 78. The processes in steps S1 to S4 are repeated until the input of the character train stream is finished in step S5. When the input of the character train stream 20 is finished, in step S6, the coding process for converting the character train in the tag information separated and stored in the tag information storing unit 78 into the corresponding block number of the dictionary in the tag dictionary storing unit 96 and using it as code data is executed by the tag character train comparing unit 97. The resultant data is stored into the tag information storing unit 78. Thus, the contents stored in the tag information storing unit 78 are as shown in the compression tag information file 36 in FIG. 26. In step S7, finally, the tag information with the code amount which was separated and encoded by the tag information storing unit 78 and the code data stored in the code storing unit 80 are, for example, sequentially selected and outputted by the code switching unit 82 and supplied as a code stream 100 to the outside. In the compressing process in FIG. 27, the separation and replacement of the tag information in steps S1 to S4, and further, the measuring process of the amount of compressed codes and the subsequent coding process of the separated tag information are time-divisionally performed. However, both of them can be processed in parallel.

Figure 28:
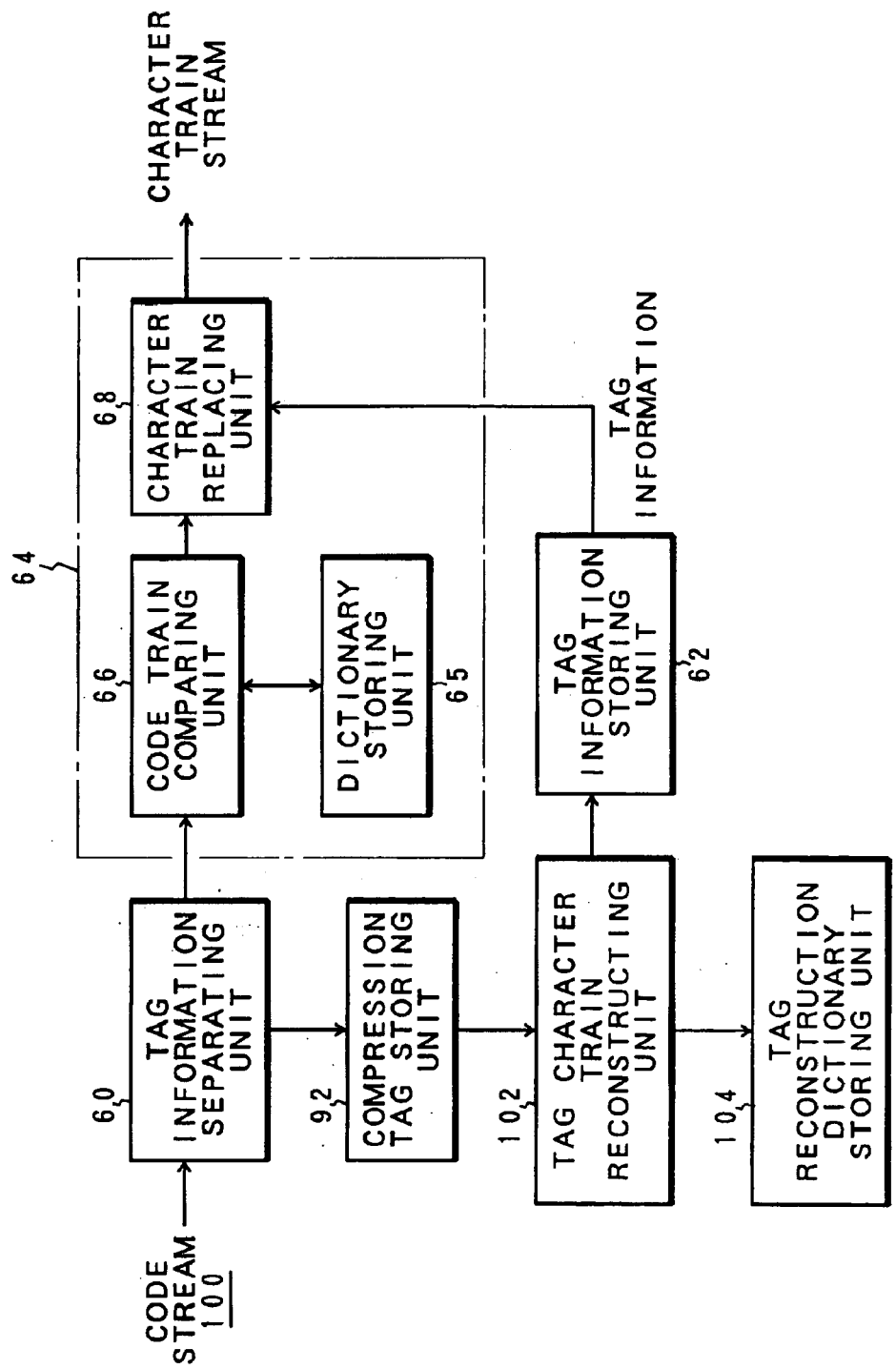
FIG. 28 is a block diagram of the third embodiment of a data reconstructing apparatus of the invention for reconstructing a code stream from the data compressing apparatus in FIG. 24.

FIG. 28 shows the third embodiment of a data reconstructing apparatus of the invention for reconstructing a character train stream from the code stream 100 outputted from the data compressing apparatus in FIG. 24. In the embodiment, the tag information separating unit 60, compression tag storing unit 92, tag information storing unit 62, and character train reconstructing unit 64 are substantially the same as those in the second embodiment in FIG. 23. Besides them, a tag character train reconstructing unit 102 and a tag reconstruction dictionary storing unit 104 are newly provided. As a tag reconstruction dictionary storing unit 104, the unit having the same dictionary structure as that in FIG. 17 is used and the stored characters become the Japanese character train which is used in the tags. The tag information separating unit 60 separates the tag information stream as shown in the contents of the compression tag information file 36 in FIG. 26 from the code stream 100 which is supplied from the data compressing apparatus side in FIG. 24 and stores it into the compression tag storing unit 92. The compression tag information stored in the compression tag storing unit 92 is reconstructed to the corresponding Japanese character train with reference to the dictionary number by the code of the tag character train in the tag reconstruction dictionary storing unit 104 by the tag character train reconstructing unit 102. The tag information including the reconstructed Japanese character train is stored into the tag information storing unit 62. The tag information separating unit 60 supplies the code stream of the document text that is sent after the compression tag information stream to the character train reconstructing unit 64. In the code train comparing unit 66, the corresponding characters or character train is reconstructed with reference to the dictionary number in the dictionary storing unit 65 by the extracted code and outputted to the character train replacing unit 68. The character train replacing unit 68 recognizes the tag code in the reconstructed character train, sequentially extracts the reconstructed tag information stored in the tag information storing unit 62 in accordance with the appearing order, replaces it by the tag code, and outputs the reconstructed character train stream. As shown in FIG. 26, the compression tag information file 36 has been stored in the compression tag storing unit 92 at a time point when the input of the compression tag information stream separated from the code stream 100 is finished. Therefore, the compression tag information file 36 is retrieved by using a specific tag as a keyword. If the coincident tag is obtained, the code amount DL as position designation information corresponding thereto is read out. It is possible to request the data compressing apparatus of FIG. 24 to transfer the code data from the position of the retrieved code amount DL. Thus, by transferring the partial compression text data of the SGML Japanese document which is necessary from the data reconstructing side to the data compressing side, the data can be easily read.

As mentioned above, according to the invention, with respect to the character train stream of the structured document such as SGML or the like including the tags, a high compression ratio is realized by separating the tag information and the text (character train) and encoding at least the text. By retrieving the separated tag information, the reading and the retrieval of the specific tag position in the compressed code data can be processed at a high speed. That is, the order of the separated tag information and that of the tag codes replaced in the code data correspond in a one-to-one correspondence relation. By retrieving the specific tag information with respect to the tag information, the position of the tag code in the code data can be specified by such orders. It is possible to easily reach the head position of the target document code data. Thus, with respect to the structured document such as an SGML including the tags, the compression and reconstruction can be performed at a high speed while maintaining a high compression ratio.

As a transmitting form from the data compressing apparatus to the data reconstructing apparatus in the invention, a communication line such as Internet or the like or a proper form of a rewritable portable medium such as optical disk cartridge, magnetic disk cartridge, or the like can be used. In the foregoing embodiments, as a compression of the character train stream in which the tag information is separated and the tag code is replaced to the position of the separated tag information, the encoding in which the character train code of a fixed length corresponding to the number of words peculiar to Japanese is allocated is performed as an example. However, it will be obviously understood that the compression by LZ77, LZ78, arithmetic encoding, or the like other than the above method can be performed. Further, the invention is not limited by the numerical values in the foregoing embodiments. Further, the invention incorporates many modifications and variations within the purview of the invention without departing from the objects and advantages thereof.

What is claimed is:

1. A data compressing apparatus generating code data from a character train stream constructed by a structured document including tags as identification information for expressing a document structure, comprising:

a tag information separating unit separating the identified tags from the character train stream and outputting the separated identified tags as a tag information stream;

a tag code replacing unit arranging a tag code for identification to a position of the character train stream from which the identified tags were separated by the tag information separating unit and outputting a tag replaced character train stream;

a character train coding unit coding the tag replaced character train stream including the tag code outputted from the tag code replacing unit and outputting a code stream;

a tag information storing unit storing the tag information stream separated by the tag information separating unit;

a code storing unit storing the code stream formed by the character train coding unit; and a code switching unit alternately selecting the tag information stream stored in the tag information storing unit and the code stream stored in the code storing unit and outputting the selected stream.

2. An apparatus according to claim 1, wherein said tag code replacing unit arranges a predetermined fixed code as said tag code to the position of the character train stream from which the tags were separated.

3. An apparatus according to claim 1, wherein said tag code replacing unit arranges a tag code indicative of an appearing order of the tags separated by said tag information separating unit to the position of the character train stream in from which the tags were separated.

4. An apparatus according to claim 1, wherein said character train coding unit comprises:

a dictionary storing unit storing a dictionary in which a character train serving as a processing unit when compressing has been registered; and a character train comparing unit comparing a partial character train in the character train stream from said tag code replacing unit with the registration character train in said dictionary storing unit, thereby detecting a partial character train which coincides with said registration character train, allocating a predetermined code every said detected partial character train, and outputting a resultant character train.

5. An apparatus according to claim 1, further comprising a tag information compressing unit compressing the tag information separated by said tag information separating unit.

6. An apparatus according to claim 1, further comprising:

a tag dictionary storing unit storing a dictionary in which a tag character train in the tag information serving as a processing unit when compressing has been registered; and a tag character train comparing unit comparing the partial character train of the character train stream included in the tag information separated by said tag information separating unit with the registration character train in said tag dictionary storing unit, thereby detecting a partial character train which coincides with said registration character train, allocating a predetermined code every said detected partial character train, and outputting a resultant character train.

7. An apparatus according to claim 1, further comprising a tag position detecting unit detecting a position of the tags in the code data formed by said character train coding unit, and wherein both the tag information separated by said tag information separating unit and designation information of the tag position detected by said tag position detecting unit are stored in said tag information storing unit.

8. An apparatus according to claim 7, wherein said tag position detecting unit detects the code amount from the head of a document or a specific tag and stores it together with the tag information into said tag information storing unit.

9. A data reconstructing apparatus reconstructing character train data from a code stream including a tag information stream and a code data stream, the tag information stream having been separated from a character train stream of a structured document and including separated tags as identification information for expressing a document structure, and the code data stream having been obtained by encoding a character train stream in which a tag code has been arranged at a position of the separated tags, comprising:

a tag information separating unit separating the tag information stream including the separated tags and the code data stream from the code stream;

a tag information storing unit storing the tag information stream separated by the tag information separating unit; and a character train reconstructing unit reconstructing the character train data including the character train and the tag code from the code data stream and, thereafter, replacing the tag code by the tag information stream stored in the tag information storing unit.

10. An apparatus according to claim 9, wherein said character train reconstructing unit comprises:

a dictionary storing unit storing a dictionary in which a reconstruction character train corresponding to a code of the character train serving as a processing unit when reconstructing has been registered;

a character train comparing unit separating a code of the character train serving as a reconstruction unit from said code stream and reconstructing the original character train with reference to said dictionary storing unit; and a character train replacing unit replacing the tag code reconstructed by said character train comparing unit by the tag information in said tag information storing unit.

11. An apparatus according to claim 9, further comprising a tag information reconstructing unit reconstructing compression data of the tag information stored in said tag information storing unit.

12. An apparatus according to claim 9, further comprising:

a tag dictionary storing unit storing a dictionary in which a reconstruction character train corresponding to a code of a tag character train serving as a processing unit when reconstructing has been registered; and a tag character train comparing unit separating a code of the tag character train serving as a reconstruction unit from the tag information separated by said tag information separating unit and reconstructing the original tag character train with reference to said dictionary storing unit.

13. A data compressing method of generating code data from a character train stream constructed by a structured document including tags as identification information for expressing a document structure, comprising:

separating the identified tags from the character train stream and outputting the separated identified tags a tag information stream;

arranging a tag code for identification to a position of the character train stream from which the identified tags were separated and outputting a tag replaced character train stream;

coding the tag replaced character train stream including the tag code and outputting a code stream;

storing the tag information stream;

storing the code stream; and alternately selecting the tag information stream and the code stream and outputting the selected stream.

* * * * *

UNITED STATES PATENT AND TRADEMARK OFFICE
CERTIFICATE OF CORRECTION

PATENT NO. : 6,871,320 B1
DATED : March 22, 2005
INVENTOR(S) : Takashi Morihara et al.

It is certified that error appears in the above-identified patent and that said Letters Patent is hereby corrected as shown below:

Column 19,
Line 21, delete "in".

Signed and Sealed this

Third Day of January, 2006

JON W. DUDAS
*Director of the United States Patent and Trademark Office*